(12) United States Patent
Hart et al.

(10) Patent No.: US 11,791,713 B2
(45) Date of Patent: Oct. 17, 2023

(54) METHOD AND APPARATUS FOR COOLING ONE OR MORE POWER DEVICES

(71) Applicant: YASA LIMITED, Kidlington (GB)

(72) Inventors: Simon David Hart, Powys (GB); Samuel David Ahearn, Montgomery (GB)

(73) Assignee: YASA LIMITED, Kidlington (GB)

( * ) Notice: Subject to any disclaimer, the term of this patent is extended or adjusted under 35 U.S.C. 154(b) by 0 days.

(21) Appl. No.: 17/560,178

(22) Filed: Dec. 22, 2021

(65) Prior Publication Data
US 2022/0200442 A1  Jun. 23, 2022

(30) Foreign Application Priority Data

Dec. 23, 2020  (GB) ...................................... 2020533

(51) Int. Cl.
| | | |
|---|---|---|
| *H02M 1/32* | (2007.01) | |
| *H02M 7/537* | (2006.01) | |
| *H02M 1/088* | (2006.01) | |
| *H02M 7/5395* | (2006.01) | |
| *H02M 7/5387* | (2007.01) | |
| *H02P 29/68* | (2016.01) | |

(Continued)

(52) U.S. Cl.
CPC ............ *H02M 1/327* (2021.05); *H02M 1/088* (2013.01); *H02M 7/537* (2013.01); *H02M 7/5387* (2013.01); *H02M 7/5395* (2013.01); *H02P 27/08* (2013.01); *H02P 29/68* (2016.02); *H05K 7/2089* (2013.01)

(58) Field of Classification Search
CPC .... H02M 1/327; H02M 1/088; H02M 7/5387; H02M 7/5395; H02P 27/08; H02P 29/68; H05K 7/2089; H05K 7/20927
See application file for complete search history.

(56) References Cited

U.S. PATENT DOCUMENTS 4,575,668 A * 3/1986 Baker ............... H02M 7/53873
                                                                                  318/811
8,395,874 B2 * 3/2013 Yamai ..................... H02M 1/32
                                                                                  361/111

(Continued)

OTHER PUBLICATIONS

UK Intellectual Property Office. Search Report issued in GB Application No. 2020533.2 dated Jun. 21, 2021. 4 pages.

*Primary Examiner* — Yusef A Ahmed
(74) *Attorney, Agent, or Firm* — Meunier Carlin & Curfman LLC

(57) ABSTRACT

Described herein is a method of cooling a plurality of power devices, where the power devices are arranged as a plurality of switches used to generate a three-phase output AC voltage. Based on power device stress data, one or more switches (associated with one or more phase output AC voltages) may be identified as requiring more cooling than other of the switches. The switches are controlled to apply a common mode component voltage to each of the three phases for at least a portion of one or more output AC voltage segments. The common mode component voltage has a maximum amplitude that is sufficient to clamp the phase AC output voltage of the identified phase(s) to the positive supply rail voltage and/or negative rail supply voltage when the respective phase AC voltage is approaching respectively the positive supply rail voltage or negative supply rail voltage to cool the identified switch(es).

26 Claims, 11 Drawing Sheets

(51) Int. Cl.
*H02P 27/08* (2006.01)
*H05K 7/20* (2006.01)

(56) References Cited

U.S. PATENT DOCUMENTS

| | | | |
|---|---|---|---|
| 8,958,222 B2 | 2/2015 | Hart | |
| 9,190,834 B2* | 11/2015 | Casares | H02H 7/1203 |
| 10,916,931 B2* | 2/2021 | Reiter | G05B 15/02 |
| 2005/0071090 A1* | 3/2005 | Katou | H02M 7/48 |
| | | | 702/33 |
| 2009/0058350 A1 | 3/2009 | Wei et al. | |
| 2009/0179608 A1* | 7/2009 | Welch | H02M 7/53875 |
| | | | 318/811 |
| 2010/0110743 A1* | 5/2010 | Yamasaki | H02M 7/53873 |
| | | | 332/109 |
| 2011/0310585 A1* | 12/2011 | Suwa | H01L 23/49575 |
| | | | 257/691 |
| 2013/0036759 A1* | 2/2013 | Harada | H02P 29/68 |
| | | | 62/259.2 |
| 2013/0066501 A1* | 3/2013 | Oyama | B62D 6/08 |
| | | | 701/22 |
| 2013/0128643 A1* | 5/2013 | Shinohara | H05K 7/20927 |
| | | | 363/131 |
| 2013/0135906 A1* | 5/2013 | Kawamura | H02P 27/085 |
| | | | 363/40 |
| 2013/0180273 A1* | 7/2013 | Hatakeyama | H02P 31/00 |
| | | | 62/115 |
| 2013/0305760 A1* | 11/2013 | Shinomoto | H02P 29/62 |
| | | | 318/473 |
| 2013/0320677 A1* | 12/2013 | Yamada | B60K 17/356 |
| | | | 318/45 |
| 2013/0335920 A1* | 12/2013 | Murata | H01L 25/112 |
| | | | 361/699 |
| 2014/0049999 A1* | 2/2014 | Hart | H02M 7/53875 |
| | | | 363/97 |
| 2014/0095104 A1* | 4/2014 | Owen | G01K 1/026 |
| | | | 702/130 |
| 2014/0326442 A1* | 11/2014 | Kurpiewski | G06F 1/206 |
| | | | 165/287 |
| 2015/0016063 A1* | 1/2015 | Higuma | H05K 7/20927 |
| | | | 361/714 |
| 2015/0016170 A1* | 1/2015 | Olarescu | H02M 7/537 |
| | | | 363/132 |
| 2015/0036400 A1* | 2/2015 | Webster | H02M 1/32 |
| | | | 363/98 |
| 2015/0049527 A1* | 2/2015 | Sugahara | H01L 23/467 |
| | | | 363/80 |
| 2015/0131351 A1* | 5/2015 | Hart | H02M 7/537 |
| | | | 363/131 |
| 2015/0295532 A1* | 10/2015 | Sakai | F04C 28/06 |
| | | | 318/472 |
| 2016/0061504 A1* | 3/2016 | Penn, II | F25B 49/022 |
| | | | 62/228.1 |
| 2016/0093788 A1* | 3/2016 | Matsumoto | H05K 7/209 |
| | | | 136/212 |
| 2016/0126882 A1* | 5/2016 | Nakao | H02K 5/22 |
| | | | 318/490 |
| 2016/0155278 A1* | 6/2016 | Nozawa | B60K 6/445 |
| | | | 701/22 |
| 2016/0315558 A1* | 10/2016 | Lee | H02M 7/5395 |
| 2016/0344304 A1* | 11/2016 | Ichihara | H02M 1/08 |
| 2016/0373047 A1* | 12/2016 | Loken | H02M 7/53875 |
| 2017/0163181 A1* | 6/2017 | Namuduri | B60L 1/003 |
| 2017/0274735 A1* | 9/2017 | Kawasaki | H02M 1/14 |
| 2017/0288595 A1* | 10/2017 | Shinomoto | H02M 7/5387 |
| 2018/0054184 A1* | 2/2018 | Wang | H03H 11/12 |
| 2018/0270995 A1* | 9/2018 | Yang | H02H 5/04 |
| 2019/0066899 A1* | 2/2019 | Sakamoto | H01F 27/10 |
| 2019/0280609 A1 | 9/2019 | Liu et al. | |
| 2019/0334454 A1* | 10/2019 | Itoh | H02M 7/537 |
| 2020/0162006 A1* | 5/2020 | Kim | H02K 5/04 |
| 2020/0204061 A1* | 6/2020 | Min | G01K 7/01 |
| 2020/0412277 A1* | 12/2020 | Natsuhara | H02M 7/53875 |
| 2021/0398951 A1* | 12/2021 | Kakimoto | B60L 15/007 |
| 2022/0020730 A1* | 1/2022 | Katoh | H01L 23/49575 |
| 2022/0038093 A1* | 2/2022 | Hart | H03K 17/166 |
| 2022/0166346 A1* | 5/2022 | Hart | H02M 7/53876 |
| 2022/0174840 A1* | 6/2022 | Hart | F28F 3/022 |
| 2022/0200436 A1* | 6/2022 | Hart | H02M 1/0054 |
| 2022/0255487 A1* | 8/2022 | Wolf | H02P 27/085 |
| 2022/0286066 A1* | 9/2022 | Nishio | H02M 1/008 |
| 2022/0319974 A1* | 10/2022 | Miyazaki | H02M 7/003 |
| 2022/0385224 A1* | 12/2022 | Sano | H02K 11/25 |

* cited by examiner

METHOD AND APPARATUS FOR COOLING ONE OR MORE POWER DEVICES

CROSS-REFERENCE TO RELATED APPLICATIONS

This application claims priority to and benefit of GB Application No. 2020533.2, filed Dec. 23, 2020, which is incorporated by reference in its entirety.

FIELD OF THE INVENTION

The present invention relates to a method cooling one or more power devices, in particular power devices used for generating a three-phase voltage for driving an electrical load, and an apparatus, such as an inverter, for generating a three-phase voltage for driving an electrical load.

BACKGROUND OF THE INVENTION

Power inverters are generally known. One example may be found in U.S. Pat. No. 8,958,222, from which FIG. 1 is taken, and shows a three phase power inverter 100 for converting a DC power supply 101 to an AC output 103 which may then be connected to a load (not shown). The inverter comprises three separate phases 200, 300, 400 (also referred to as phases U, V, W respectively). Each phase includes two switches in series: 200*a*, 200*b* in phase 200/U; 300*a*, 300*b* in phase 300/V; and 400*a*, 400*b* in phase 400/W. Switches 200*a*. 300*a* and 400*a* are connected to the positive rail 105 (and may be referred to as the "upper" switches) and switches 200*b*, 300*b* and 400*b* are connected to the negative rail 107 (and may be referred to as the "lower" switches). In FIG. 1, each switch may be an IGBT (insulated gate bipolar transistor) and, for each IGBT, an associated anti-parallel diode may be used (not shown). However, any switches with fast switching capability may be used. A control system (such as a processor) (not shown) controls the switching of the switches 200*a*, 200*b*, 300*a*, 300*b*, 400*a*, 400*b* to control the AC output of the inverter 100. The power inverter also includes a DC bus capacitor 102, which provides a more stable DC voltage, limiting fluctuations as the inverter sporadically demands heavy current.

A sinusoidal output current can be created at AC output 103 by a combination of switching states of the six switches. However, the inverter 100 must be controlled so that the two switches in the same phase are never switched on at the same time, so that the DC supply 101 is not short circuited. Thus, if 200*a* is on, 200*b* must be off and vice versa; if 300*a* is on, 300*b* must be off and vice versa; and if 400*a* is on, 400*b* must be off and vice versa. This results in eight possible switching vectors for the inverter, as shown in Table 1. In Table 1, the vector values are the states of the three upper switches 200*a*, 300*a*, 400*a*, with the three lower switches 200*b*, 300*b*, 400*b* necessarily taking the opposite state to avoid shorting out the DC supply.

FIG. 2 shows the six active vectors and the two zero voltage vectors of Table 1 graphically portrayed in an inverter voltage switching hexagon. Such vectorial representation of three-phase systems is well known to the skilled person and will not be described in detail. However, in general, any three-phase system can be represented uniquely by a rotating vector $V_S$, as shown in FIG. 2. The rotating vector $V_S$ comprises components of the six active vectors shown in Table 1 and FIG. 2. This is known as Space Vector Modulation (SWM). The voltage at the AC output 103 can be changed by varying the ratio between the zero voltage vectors $V_0$ and $V_7$ and the active vector $V_S$ (comprising components of $V_1$ to $V_6$) (the modulation index) by pulse width modulation (PWM) techniques.

FIG. 3 shows an example of pulse width space vector modulation over one switching period according to the prior art. The switching function for each switch 200*a*, 300*a*, 400*a* is a time waveform taking the value 1 when the switch is on and 0 when the switch is off. Referring to FIG. 3, during the first period t0/2, all three switches 200*a*, 300*a*, 400*a* are off (value 0) which produces vector $V_O$ of Table 1. $V_O$ is a zero-voltage vector, so this time period is an inactive period. In the second period t1, switch 200*a* takes the value 1 and switches 300*a* and 400*a* take the value 0, which produces vector $V_1$, which is an active vector. In the third period t2, switches 200*a* and 300*a* take the value 1 and switch 400*a* takes the value 0, which produces vector $V_2$, which is also an active vector. Finally, during the fourth period t0/2, all three switches 200*a*, 300*a*, 400*a* are on (value 1) which produces zero voltage vector $V_7$ of Table 1. Thus, the active periods are t1 and t2 and the inactive period is t0. The ratio between the total active period (in this case, t1+t2) and total inactive period (in this case, t0/2+t0/2=t0) determines the output voltage at the AC output.

FIG. 4 shows phase voltages (with respect to the 0V line shown in FIG. 1, which is half of the dc bus) with symmetric switching versus output voltage angle (with a DC bus of 250V and a 200V peak demand). FIG. 5 shows the resulting line to line voltage as seen by the motor load.

A practical implementation of the inverter of FIG. 1 utilises a plurality of power devices mounted on heatsinks within a chamber flooded with a cooling fluid. The cooling fluid flows through the chamber between an inlet and outlet to cool the heatsinks and thus the plurality of power devices.

Each of the switches (U_upper 200*a*, U_lower 200*b*, V_upper 300*a*, V_lower 300*b*, W_upper 400*a*, W_lower 400*b*) is comprised of a plurality of power devices, preferably, but not limited to, 7 power devices per switch. Each of the power devices may comprise a SiC die, although other implementations may be possible. Each group of 7 devices (that is each group of power devices that are arranged as one of the phase switches 200, 300, 400) are mounted on two heatsinks. The first heatsink has a bank of 4 of the power devices, and the second heatsink has a bank of 3 devices. As

| Vector | 200a | 300a | 400a | 200b | 300b | 400b | $V_{UW}$ | $V_{WV}$ | $V_{VU}$ | |
|---|---|---|---|---|---|---|---|---|---|---|
| $V_0 = \{000\}$ | OFF | OFF | OFF | ON | ON | ON | 0 | 0 | 0 | Zero |
| $V_1 = \{100\}$ | ON | OFF | OFF | OFF | ON | ON | $+V_{dc}$ | 0 | $-V_{dc}$ | Active |
| $V_2 = \{110\}$ | ON | ON | OFF | OFF | OFF | ON | 0 | $+V_{dc}$ | $-V_{dc}$ | Active |
| $V_3 = \{010\}$ | OFF | ON | OFF | ON | OFF | ON | $-V_{dc}$ | $+V_{dc}$ | 0 | Active |
| $V_4 = \{011\}$ | OFF | ON | ON | ON | OFF | OFF | $-V_{dc}$ | 0 | $+V_{dc}$ | Active |
| $V_5 = \{001\}$ | OFF | OFF | ON | ON | ON | OFF | 0 | $-V_{dc}$ | $+V_{dc}$ | Active |
| $V_6 = \{101\}$ | ON | OFF | ON | OFF | ON | OFF | $+V_{dc}$ | $-V_{dc}$ | 0 | Active |
| $V_7 = \{101\}$ | ON | ON | ON | OFF | OFF | OFF | 0 | 0 | 0 | Zero | such, there are 12 heatsinks in total with alternately 4 and 3 power devices attached thereto.

In such an arrangement, where the power devices are mounted in a flooded chamber, the cooling of the power devices results in an imbalance of temperatures between switches even if the same losses are experienced by each switch. This is generally due to the passing of fluid from one switch to the next where the fluid temperature increases. Thus, there can exist a temperature difference between the switch that received the coldest fluid and the switch that sees the hottest fluid.

FIG. 6 shows an temperature plot based on the power devices in such a flooded chamber. The temperatures of devices as the oil travels from the first bank of 4 devices through the thermal chamber to the last bank of 3 devices. The switch position goes U_upper, U_lower, V_upper, V_lower, W_upper, W_lower, from left to right of the graph which is also the order of the fluid as it passes through the thermal chamber. The vertical dotted lines show the banks as the fluid progresses through the 12 heatsinks starting with 4 devices making up part of the U_upper switch.

The device temperature attached to the same heatsink (so in the same bank) are very similar. The temperature of the heatsinks increases as the oil heats up as it moves from heatsink to heatsink through the thermal chamber.

With a modulation scheme such as Space Vector Modulation (SVM), the hottest devices on the last heatsink to see fluid and are at a junction (die) temperature of ~157° C. The spread of temperatures is from ~138° C. to ~157° C. so ~19° C. variation across all devices. In designing systems using such an arrangement, the maximum device junction is used when calculating the device lifetimes and thus determines how many devices are required to provide the inverter target rating.

We have therefore appreciated the need for an improved method and apparatus in order to reduce the temperature variation across all of the power devices.

SUMMARY OF THE INVENTION

The present invention therefore provides a method of generating a three-phase output voltage, and an inverter for generating a three-phase output voltage, for driving an electrical load in accordance with the independent claims appended hereto.

Further advantageous embodiments are also provided in accordance with the dependent claims, also appended hereto.

We describe a method of cooling one or more power devices, the one or more power devices being arranged as a plurality of switches configured to generate a three-phase AC output, the method comprising: receiving an input voltage from a voltage source and controlling the plurality of switches, using Pulse Width Modulation (PWM) over a plurality of PWM periods, to generate a three phase AC output for an electrical load, the input voltage having a positive supply rail voltage and a negative supply rail voltage, each of the three phases having one or more upper switches connected to the positive supply rail voltage and one or more lower switches connected to the negative supply rail voltage, each of the three phase AC output voltages having an amplitude and angle that varies over a plurality of segments, each segment representing a period of angular position, and wherein each of the three phase AC outputs are offset from one another in angle; receiving power device stress data, the power device stress data indicating one or more operating parameters of one or more of the plurality of power devices, and/or one or more of the switches and/or the electrical load; identifying from the received power device stress data which one or more of the switches requires cooling; identifying a respective one or more phases associated with the one or more of the identified switches requiring cooling; controlling the plurality of switches to apply a common mode component voltage to each of the three phases for at least a portion of one or more segments, wherein the common mode component voltage has a maximum amplitude that is sufficient to clamp the phase AC output voltage of a respective identified phase associated with the one or more identified switches requiring cooling, to the positive supply rail voltage and/or negative rail supply voltage when the respective phase AC voltage is approaching respectively the positive supply rail voltage or negative supply rail voltage.

By clamping the identified phase AC output voltage(s) to either or both of the positive or negative supply rail voltages, the switch(es) associated with the identified phase output AC voltage(s) are cooled due to the reduction in switching loss.

When the identified switches requiring cooling comprises one or more switches from a single identified phase of the three phases, the maximum amplitude of the common mode component voltage within the respective segment is sufficient to clamp the identified single phase AC output voltage to the positive supply rail voltage and/or negative rail supply voltage when the identified single phase AC output voltage is approaching respectively the positive supply rail voltage or negative supply rail voltage.

The identified single phase AC output voltage may be clamped to the positive supply rail voltage when the single identified phase AC output voltage is the most positive phase AC output voltage of the three phase AC output voltages, and may be clamped to the negative rail supply voltage when the single identified phase AC output voltage is the most negative phase AC output voltage of the three phase AC output voltages.

When the identified switches requiring cooling comprise first one or more switches from a first identified phase and second one or more switches from a second identified phase of the three phases, the maximum amplitude of the common mode component voltage within the respective segment is sufficient to clamp the first identified single phase AC output voltage to the positive supply rail voltage and/or negative rail supply voltage when the first identified single phase AC output voltage is approaching respectively the positive supply rail voltage or negative supply rail voltage, and wherein the maximum amplitude of the common mode component voltage within the respective segment is sufficient to clamp the second identified single phase AC output voltage to the positive supply rail voltage and/or negative rail supply voltage when the second identified single phase AC output voltage is approaching respectively the positive supply rail voltage or negative supply rail voltage.

The first and second phase AC output voltages may be clamped to the positive supply rail voltage in turn and/or the negative supply rail voltage in turn.

The identified first phase AC output voltage may be clamped to the positive supply rail voltage when the first phase AC output voltage is the most positive phase AC output voltage of the three phase AC output voltages, and clamped to the negative rail supply voltage when the first phase AC output voltage is the most negative phase AC output voltage of the three phase AC output voltages.

The identified second phase AC output voltage may be clamped to the positive supply rail voltage when the second phase AC output voltage is the most positive phase AC output voltage of the three phase AC output voltages, and may be clamped to the negative rail supply voltage when the second phase AC output voltage is the most negative phase AC output voltage of the three phase AC output voltages.

The first identified one or more switches are switches that are identified as requiring more cooling than the second identified one or more switches.

When the identified switches requiring cooling comprise one or more upper switches from one or more respective phases, the maximum amplitude of the common mode component voltage within the respective segment is sufficient to clamp the respective phase AC output voltage associated with the respective identified one or more upper switches to the positive supply rail voltage. When there are two or more respective phases, the maximum amplitude of the common mode component voltage within a respective segment is sufficient to clamp each of the two or more phase AC output voltages associated with the respective identified one or more upper switches to the positive supply rail voltage. The two or more phase AC output voltages are clamped to the positive supply rail voltage in turn.

The identified phase AC output voltage associated with the identified one or more upper switches may be clamped to the positive supply rail voltage when the respective identified phase AC output voltage is the most positive phase AC output voltage of the three phase AC output voltages.

When the identified switches requiring cooling comprise one or more lower switches from one or more respective phases, the maximum amplitude of the common mode component voltage within the respective segment is sufficient to clamp the respective phase AC output voltage associated with the respective identified one or more lower switches to the negative supply rail voltage. When there are two or more respective phases, the maximum amplitude of the common mode component voltage within a respective segment is sufficient to clamp each of the two or more phase AC output voltages associated with the respective identified one or more lower switches to the negative supply rail voltage. The two or more phase AC output voltages are clamped to the negative supply rail voltage in turn.

The identified phase AC output voltage associated with the identified one or more lower switches may be clamped to the negative supply rail voltage when the respective identified phase AC output voltage is the most negative phase AC output voltage of the three phase AC output voltages.

The power device stress data may comprise one or more of an output current for one or more phase AC outputs, a temperature of one or more of the power devices, a temperature of one or more of the switches, an operating condition of the electrical load. Receiving power device stress data may comprise receiving the power device stress data from one or more of the power devices, one or more of the switches and/or one the electrical load. Receiving the power device stress data may instead comprise receiving data from a model defining a plurality of operating parameters of one or more of the power devices, one or more of the switches, and/or the electrical load in a plurality of operating conditions. When receiving data from a model, receiving the power device stress data may comprise selecting data from the model based on an operating condition of the one or more power devices, the one or more switches and/or the electrical load.

The common mode component voltage may be varied over the angle within the respective segment between the minimum value and the maximum value using a slew value, the slew value comprising a variable scalar value ranging between a respective minimum slew value and a respective maximum slew value within the respective segment. The slew value may be varied between its minimum and maximum values dependent on the AC output angular position within each segment.

The above technique, referred to herein as Slew Controlled Edge Reduction (SCER), enables the rising and falling edges between the underlying modulation scheme (for example SVM) and the clamping scheme (where the output voltages are clamped in turn to the positive and negative supply rails) to be softened controllably to reduce the NVH and EMI issues often associated with the pure clamping technique.

The slew value is preferably below its maximum value for a portion of the segment coinciding with a portion of the respective rising or the respective falling edge of the identified phase AC output. The slew value is preferably at its maximum value for a portion of the segment to clamp the identified phase AC output to the respective supply rail.

The transition of the slew value between its minimum and maximum values may have a shape defined by a portion of a circular function.

In the methods where the shape is defined by a portion of a circular function, for an AC output voltage angular position within a first section of the respective segment, the segment having 30° of angular positions, the slew value may have a magnitude defined by a rising portion of a sinusoid between its minimum value and its maximum value over the first section.

The duration of the first section of the segment may be based on a Slew Factor, the Slew Factor being a scalar value to control the duration of the transition between the minimum and maximum values. The first section may be defined by the AC output voltage having a product of its angular position and the Slew Factor having an angle that is less than 30°.

The slew value over the first section may be defined by a sinusoid having a period that is defined as a product of 6 times the electrical frequency of the AC output voltage and the Slew Factor. The slew value over the first section may be defined by:

$$\mathrm{SlewValue} = -0.5 * \cos(6*(\mathrm{SlewFactor}*\gamma)) + 0.5$$

Where $\gamma$ defines the AC output voltage angular position.

The Slew Factor value may be chosen from a plurality of values based on a modulation index and/or an output frequency of the output AC voltage.

When he slew value has a maximum value for a second section of the respective segment, the first and second sections may be consecutive.

In the methods where the shape is defined by a portion of a circular function, for an AC output voltage angular position within a first section of the respective segment, the segment having 30° of angular positions, the slew value may have a maximum value for the first section. The slew value may have a shape defined by a falling portion of a sinusoid between its maximum value and its minimum value over the second section, wherein the first and second sections are consecutive.

The duration of the second section may be based on a Slew Factor, the Slew Factor being a scalar value to control the duration of the transition between the minimum and maximum values.

The slew value over the second section may be defined by a sinusoid having a period that is defined as a product of 6 times the electrical frequency of the AC output voltage and the Slew Factor. The sinusoid may be phase shifted.

The slew value may be defined by:

$$SlewValue = 0.5 * \cos(6*(SlewFactor*(\gamma - SlewOffset))) + 0.5$$

Where γ defines the AC output voltage angular position, and SlewOffset is a starting angle of the second section.

The starting angle of the second section may be defined by the AC output voltage having an angular position that is greater than a difference between the duration of a segment and a quotient of the duration of a segment and the Slew Factor.

The Slew Factor value may be chosen from a plurality of values based on a modulation index and/or output frequency of the output AC voltage.

As an alternative to the sinusoidal shaped Slew Value, the transition of the slew value between its minimum and maximum values may occurs linearly, exponentially, or logarithmically.

In any of the above, the common mode component voltage may be applied when a modulation index and/or output frequency of the output voltage is greater than a threshold.

We also describe an inverter for generating a three-phase voltage for powering an electrical load, the inverter comprising: an input for receiving input voltages, the input voltage having a positive supply rail voltage and a negative supply rail voltage; three AC outputs, one per phase, for outputting a three phase AC output voltage for powering an electrical load; a plurality of switches connected between the input voltages and the three AC outputs and being arranged to generate the three AC output voltages, each of the switches comprising one or more power devices, and each of the three phases having one or more upper switches connected to the positive supply rail voltage and one or more lower switches connected to the negative supply rail voltage; a controller coupled to the plurality of switches for controlling the plurality of switches, using Pulse Width Modulation (PWM) over a plurality of PWM periods, to generate a three phase AC output for an electrical load, each of the three phase AC output voltages having an amplitude and angle that varies over a plurality of segments, each segment representing a period of angular position, and wherein each of the three phase AC outputs are offset from one another in angle; wherein the controller is configured to: receive power device stress data, the power device stress data indicating one or more operating parameters of one or more of the plurality of power devices, and/or one or more of the switches and/or the electrical load; identify from the received power device stress data which one or more of the switches requires cooling; identify a respective one or more phases associated with the one or more of the identified switches requiring cooling; and control the plurality of switches to apply a common mode component voltage to each of the three phases for at least a portion of one or more segments, wherein the common mode component voltage has a maximum amplitude that is sufficient to clamp the phase AC output voltage of a respective identified phase associated with the one or more identified switches requiring cooling, to the positive supply rail voltage and/or negative rail supply voltage when the respective phase AC voltage is approaching respectively the positive supply rail voltage or negative supply rail voltage, and wherein clamping the identified one or more phase AC output voltages to the respective power rail cools the one or more identified switches.

By clamping the identified phase AC output voltage(s) to either or both of the positive or negative supply rail voltages, the switch(es) associated with the identified phase output AC voltage(s) are cooled due to the reduction in switching loss.

When the identified switches requiring cooling comprises one or more switches from a single identified phase of the three phases, the maximum amplitude of the common mode component voltage within the respective segment is sufficient to clamp the identified single phase AC output voltage to the positive supply rail voltage and/or negative rail supply voltage when the identified single phase AC output voltage is approaching respectively the positive supply rail voltage or negative supply rail voltage.

The controller may be configured to clamp the identified single phase AC output voltage to the positive supply rail voltage when the single identified phase AC output voltage is the most positive phase AC output voltage of the three phase AC output voltages, and configured to clamp to the negative rail supply voltage when the single identified phase AC output voltage is the most negative phase AC output voltage of the three phase AC output voltages.

When the identified switches requiring cooling comprise first one or more switches from a first identified phase and second one or more switches from a second identified phase of the three phases, the maximum amplitude of the common mode component voltage within the respective segment is sufficient to clamp the first identified single phase AC output voltage to the positive supply rail voltage and/or negative rail supply voltage when the first identified single phase AC output voltage is approaching respectively the positive supply rail voltage or negative supply rail voltage, and wherein the maximum amplitude of the common mode component voltage within the respective segment is sufficient to clamp the second identified single phase AC output voltage to the positive supply rail voltage and/or negative rail supply voltage when the second identified single phase AC output voltage is approaching respectively the positive supply rail voltage or negative supply rail voltage.

The controller may be configured to clamp the first and second phase AC output voltages to the positive supply rail voltage in turn and/or the negative supply rail voltage in turn.

The controller may be configured to clamp the identified first phase AC output voltage to the positive supply rail voltage when the first phase AC output voltage is the most positive phase AC output voltage of the three phase AC output voltages, and the controller may be configured to clamp to the negative rail supply voltage when the first phase AC output voltage is the most negative phase AC output voltage of the three phase AC output voltages.

The controller may be configured to clamp the identified second phase AC output voltage to the positive supply rail voltage when the second phase AC output voltage is the most positive phase AC output voltage of the three phase AC output voltages, and clamped to the negative rail supply voltage when the second phase AC output voltage is the most negative phase AC output voltage of the three phase AC output voltages.

The first identified one or more switches may be switches that are identified as requiring more cooling than the second identified one or more switches.

The identified switches requiring cooling may comprise one or more upper switches from one or more respective phases, the maximum amplitude of the common mode component voltage within the respective segment is sufficient to clamp the respective phase AC output voltage associated with the respective identified one or more upper switches to the positive supply rail voltage.

When there are two or more respective phases, the maximum amplitude of the common mode component voltage within a respective segment is sufficient to clamp each of the two or more phase AC output voltages associated with the respective identified one or more upper switches to the positive supply rail voltage. The controller may be configured to clamp the two or more phase AC output voltages to the positive supply rail voltage in turn.

The controller may be configured to clamp the identified phase AC output voltage associated with the identified one or more upper switches to the positive supply rail voltage when the respective identified phase AC output voltage is the most positive phase AC output voltage of the three phase AC output voltages.

The identified switches requiring cooling may comprise one or more lower switches from one or more respective phases, the maximum amplitude of the common mode component voltage within the respective segment is sufficient to clamp the respective phase AC output voltage associated with the respective identified one or more lower switches to the negative supply rail voltage.

When there are two or more respective phases, the maximum amplitude of the common mode component voltage within a respective segment is sufficient to clamp each of the two or more phase AC output voltages associated with the respective identified one or more lower switches to the negative supply rail voltage.

The controller may be configured to clamp the two or more phase AC output voltages to the negative supply rail voltage in turn.

The controller may be configured to clamp the identified phase AC output voltage associated with the identified one or more lower switches to the negative supply rail voltage when the respective identified phase AC output voltage is the most negative phase AC output voltage of the three phase AC output voltages.

The power device stress data may comprises one or more of an output current for one or more phase AC outputs, a temperature of one or more of the power devices, a temperature of one or more of the switches, an operating condition of the electrical load. The controller may be configured to receive the power device stress data from one or more of the power devices, one or more of the switches and/or one the electrical load.

The controller may be configured to receive the power device stress data from a model defining a plurality of operating parameters of one or more of the power devices, one or more of the switches, and/or the electrical load in a plurality of operating conditions. In this case, the controller may be configured to select data from the model based on an operating condition of the one or more power devices, the one or more switches and/or the electrical load.

The common mode component voltage may be varied over the angle within the respective segment between the minimum value and the maximum value using a slew value, the slew value comprising a variable scalar value ranging between a respective minimum slew value and a respective maximum slew value within the respective segment.

As with the method, the SCER technique enables the rising and falling edges between the underlying modulation scheme (for example SVM) and the clamping scheme (where the output voltages are clamped in turn to the positive and negative supply rails) to be softened controllably to reduce the NVH and EMI issues often associated with the pure clamping technique.

The controller may vary the slew value between its minimum and maximum values dependent on the AC output angular position within each segment.

The slew value may be below its maximum value for a portion of the segment coinciding with a portion of the respective rising or the respective falling edge of the identified phase AC output. The slew value may be at its maximum value for a portion of the segment to clamp the identified phase AC output.

The controller may control the transition of the slew value between its minimum and maximum values using a shape defined by a portion of a circular function.

For an AC output voltage angular position within a first section of the respective segment, the segment having 30° of angular positions, the controller may controls the slew value to have a magnitude defined by a rising portion of a sinusoid between its minimum value and its maximum value over the first section.

The controller may control the duration of the first section of the segment based on a Slew Factor, the Slew Factor being a scalar value to control the duration of the transition between the minimum and maximum values. The first section may be defined by the AC output voltage having a product of its angular position and the Slew Factor having an angle that is less than 30°.

The controller may control the slew value over the first section defined by a sinusoid having a period that is defined as a product of 6 times the electrical frequency of the AC output voltage and the Slew Factor.

The controller may controls the slew value over the first section using:

$$\text{SlewValue} = -0.5 * \cos(6*(\text{SlewFactor}*\gamma)) + 0.5$$

Where $\gamma$ defines the AC output voltage angular position.

The controller may select the Slew Factor value from a plurality of values based on a modulation index and/or an output frequency of the output AC voltage.

The controller may control the slew value to have a maximum value for a second section of the respective segment, the first and second sections being consecutive.

For an AC output voltage angular position within a first section of the respective segment, the segment having 30° of angular positions, the controller may control the slew value to have a maximum value for the first section. The controller may control the slew value to have a shape defined by a falling portion of a sinusoid between its maximum value and its minimum value over the second section, wherein the first and second sections are consecutive.

The controller may control the duration of the second section based on a Slew Factor, the Slew Factor being a scalar value to control the duration of the transition between the minimum and maximum values.

The controller may control the slew value over the second section defined by a sinusoid having a period that is defined as a product of 6 times the electrical frequency of the AC output voltage and the Slew Factor. The sinusoid may be phase shifted.

The controller may controls the slew value using:

$$\text{SlewValue} = 0.5 * \cos(6*(\text{SlewFactor}*(\gamma - \text{SlewOffset}))) + 0.5$$

Where $\gamma$ defines the AC output voltage angular position, and SlewOffset is a starting angle of the second section.

The starting angle of the second section may be defined by the AC output voltage having an angular position that is greater than a difference between the duration of a segment and a quotient of the duration of a segment and the Slew Factor.

The controller may select the Slew Factor value from a plurality of values based on a modulation index and/or output frequency of the output AC voltage.

In an alternative to the shape of the slew being defined by a circular function, the controller may control the transition of the slew value between its minimum and maximum values linearly, exponentially, or logarithmically.

The controller may apply the common mode component voltage when a modulation index and/or the output frequency of the output voltage is greater than a threshold.

In any of the above, the electrical load may comprise an electric motor or generator, or other electrical loads such as heaters and the like. The method is suitable for any type of load requiring an AC input.

LIST OF FIGURES

The present invention will now be described, by way of example only, and with reference to the accompanying figures, in which.

Figure 17:
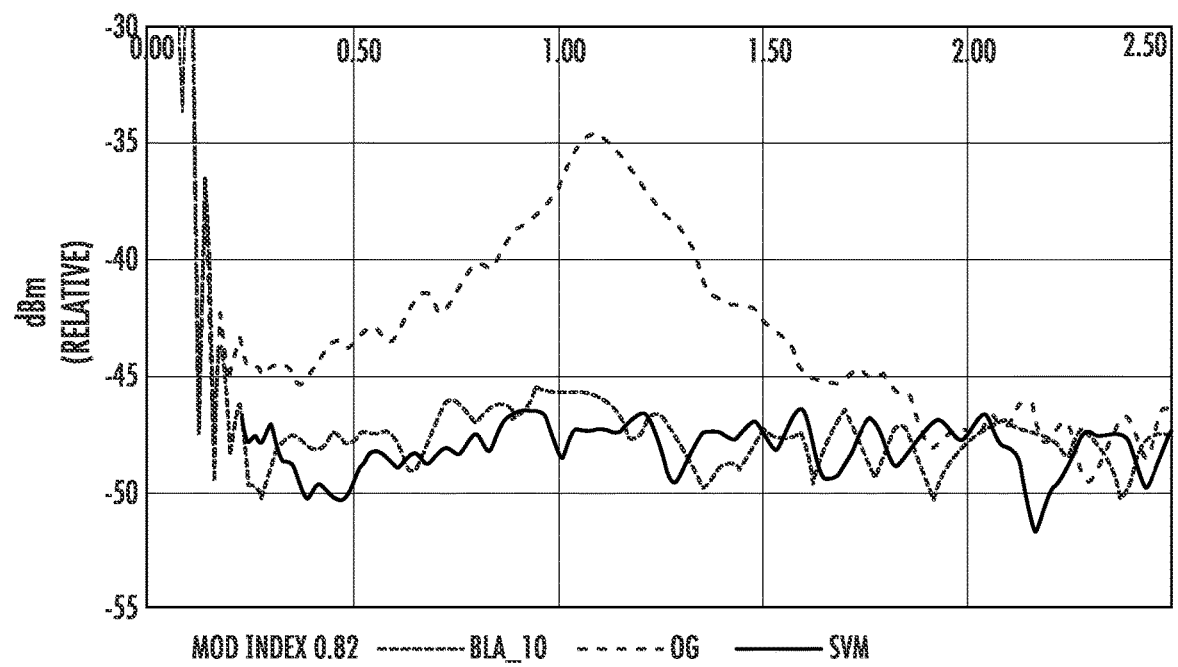
FIG. 17 shows the spectrum of the star point measured common mode current for frequencies between 0 Hz and 25 kHz.
Figure 18:
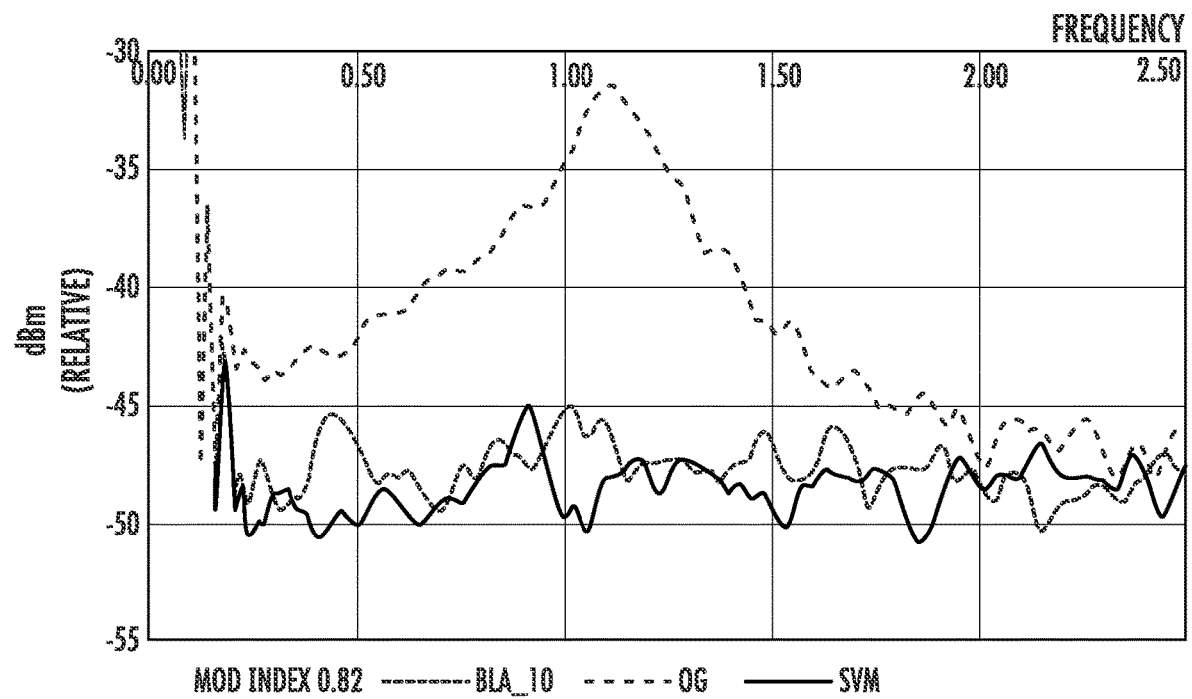
Figure 19:
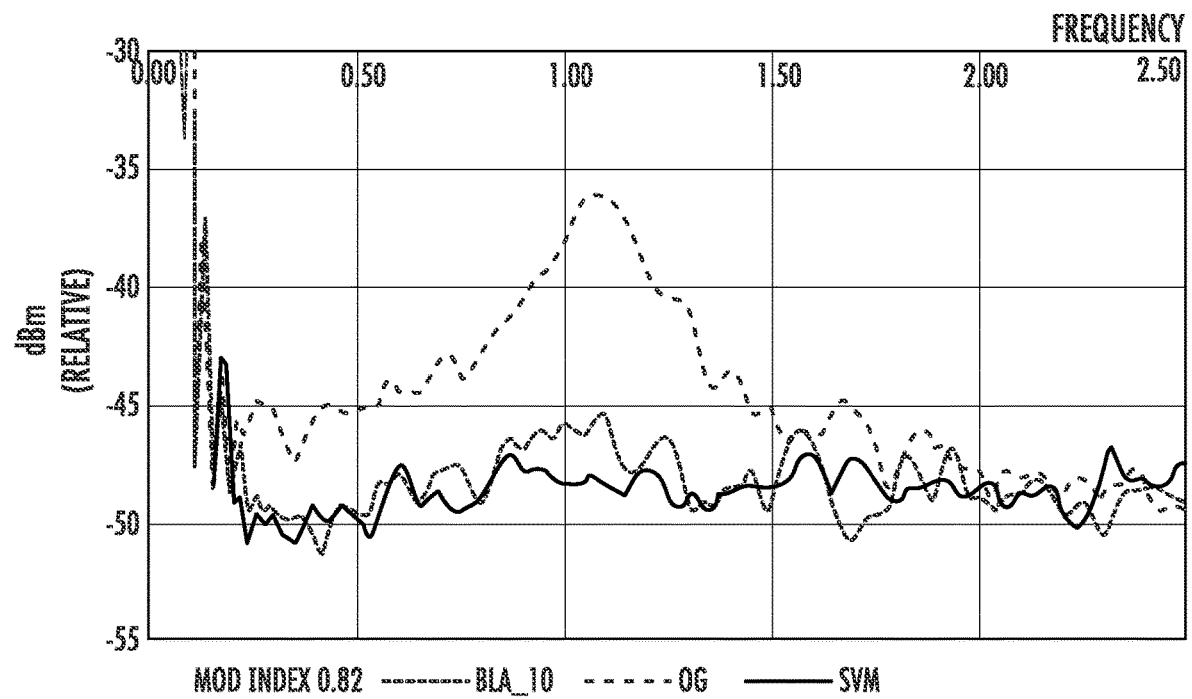

FIG. 18 shows the spectrum of the star point measured common mode current for frequencies between 0 Hz and 25 kHz for a lower modulation index than FIG. 17; and FIG. 19 shows the spectrum of the star point measured common mode current for frequencies between 0 Hz and 25 kHz for a higher modulation index than FIG. 18.

DETAILED DESCRIPTION OF THE PREFERRED EMBODIMENTS

In brief, we will describe a method of cooling a plurality of power devices, where the power devices are arranged a s plurality of switches used to generate a three-phase output AC voltage. Based on power device stress data, one or more switches (associated with one or more phase output AC voltages) may be identified as requiring more cooling than other of the switches. All of the switches are controlled to apply a common mode component voltage to each of the three phases for at least a portion of one or more output AC voltage segments. The common mode component voltage has a maximum amplitude that is sufficient to clamp the phase AC output voltage of the identified phase(s) to the positive supply rail voltage and/or negative rail supply voltage when the respective phase AC voltage is approaching respectively the positive supply rail voltage or negative supply rail voltage in order to cool the identified switch(es).

By clamping the identified phase AC output voltage(s) to either or both of the positive or negative supply rail voltages, the switch(es) associated with the identified phase output AC voltage(s) are cooled due to the reduction in switching loss.

Whilst clamping techniques, where phase output AC voltages are held at either the positive and/or negative supply rail voltages, are known, the identification (using power device stress data) of specific switches for cooling and control of the common mode component voltage in order to clamp the output AC voltages of those specific switches to the supply rail(s) enables the cooling of banks of switches to be more balanced. Balancing the cooling reduces the variation of temperature across all banks of switches within a system such as an inverter, which aids in the design of such systems.

The techniques described below utilise a modified bus clamping technique, as controlling various switches to clamp one or more phase AC output voltages to a supply rail may reduce the switching loss and the conduction loss.

Four main scenarios are envisaged where the balanced cooling technique may be applied:
1. Single-phase cooling (cooling U, V or W)
2. Multi-phase cooling (cooling two phases)
3. Upper switch cooling (cooling one or more "Upper" switches from one or more phases)
4. Lower switch cooling (cooling one or more "Lower" switches from one or more phases)

Each of the scenarios above rely on the identification of the switches that require cooling. Broadly speaking the method has the following common steps:
- receiving power device stress data (indicating one or more operating parameters of one or more of the plurality of power devices, and/or one or more of the switches and/or the electrical load);
- identifying from the received power device stress data which one or more of the switches requires cooling;
- identifying a respective one or more phases associated with the one or more of the identified switches requiring cooling;

Once the phase voltage(s) associated with the switch(es) requiring cooling have been identified, the switches are controlled to apply a common mode component voltage to each of the three phases for at least a portion of one or more phase output voltage segments. In the method, the common mode component voltage has a maximum amplitude that is sufficient to clamp the phase AC output voltage of the identified phase(s) to the positive supply rail voltage and/or negative rail supply voltage when the respective phase AC voltage is approaching respectively the positive supply rail voltage or negative supply rail voltage.

The power device stress data used to identify the switch(es) requiring cooling may comprise one or more of an output current for one or more phase AC outputs, a temperature of one or more of the power devices, a temperature of one or more of the switches, an operating condition of the electrical load. Alternatively, the power device stress data may comprise data from a model defining a plurality of operating parameters of one or more of the power devices, one or more of the switches, and/or the electrical load in a plurality of operating conditions.

Accumulated temperature or current within the inverter and/or load may be used to create stress indicators. These can be in bands, for example low current/temp (below a threshold where wear/stress is unlikely), full current/temp (above a threshold where wear/stress will be eating into the design life of the device where once the design life has been reached a servicing need will be reported; there is a desire to balance this across switches so that all devices are replaced after a longer period instead of after a shorter period because of one switch) and over current/temp (where design life might be reduced and thus will trigger derating).

Which switches and which phases are clamped are dependent on the four scenarios mentioned above, which we shall discuss in turn:

Control Schemes

1. Single-Phase Cooling

This is an asymmetrical method with respect to the phases, so may control the switching loss and the conduction loss distributions. The aim in this scenario is to cool the switches (so upper and lower) associated with the one identified phase (U, V or W).

The fundamental principle behind this scenario is that the modulation scheme (for example SVM) is adapted to offset the phase AC output voltage of the identified phase when its magnitude is the most positive of all of the phases or when the magnitude is the most negative of all of the phases.

When the identified phase AC output is the most positive, a common mode component voltage is applied to the that phase AC output to offset, or clamp, the phase AC output to the positive supply rail. When the identified phase AC output is the most negative, a common mode component voltage is applied to the that phase AC output to offset, or clamp, the phase AC output to the negative supply rail.

The common mode component voltage is applied to all phases simultaneously. Whilst the voltage levels for each phase output relative to ground are shifted, the common mode component voltage cancels out between respective line outputs, so the electrical load still sees a (preferably) sinusoidal output voltage.

Figure 7:
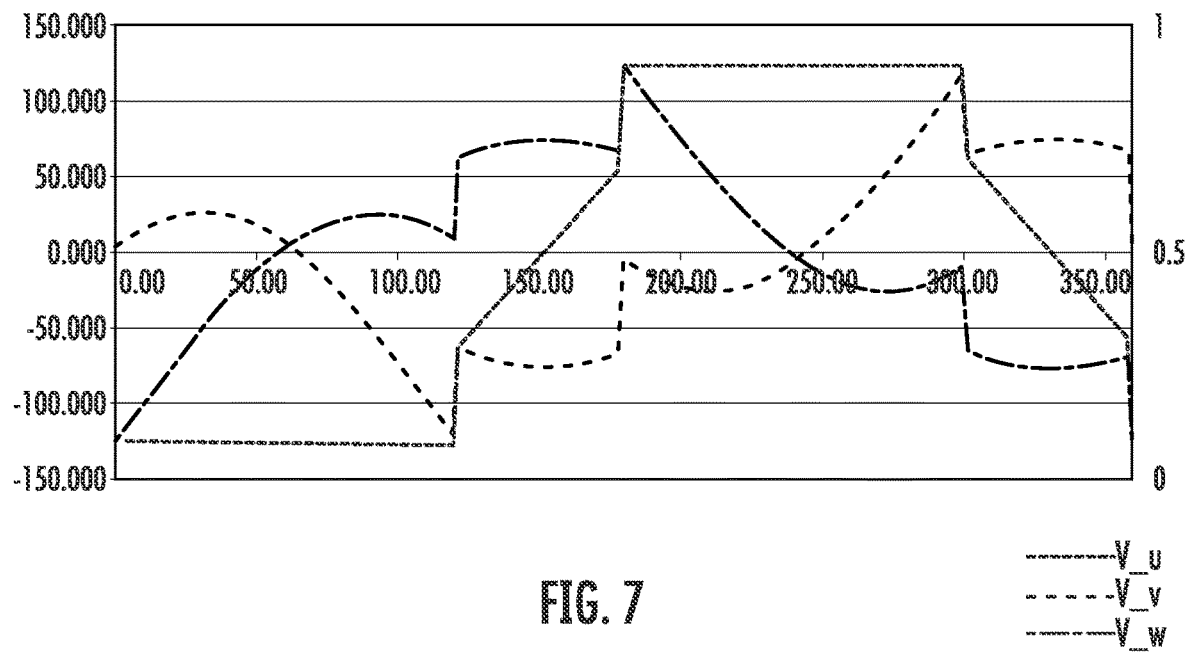
FIG. 7 shows an example output AC voltage plot for a whole waveform cycle for a single-phase cooling scheme.

FIG. 7 shows an example output AC voltage plot for a whole waveform cycle for a single-phase cooling scheme. The voltages are with respect to ground for each of the phases.

In this example, one or more of the switches associated with the U phase have been identified as requiring cooling. As such, the U phase output AC voltage is clamped for a portion of the waveform cycle alternately to the negative supply rail (when the U phase was approaching the negative supply rail and was the most negative voltage) and the positive supply rail (when the U phase was approaching the positive supply rail and had the most positive voltage) via the application of a common mode component voltage. The common mode component voltage is also applied to the other two phases not identified as requiring cooling.

Clamping this way thus reduces the switching losses in the switches associated with the U phase, and thus those switches will generate less heat compared to the switches associated with the other phases when this technique is being applied. The V and W switches are controlled to provide the correct output voltage to the electrical load.

The V or W phase may instead be cooled if identified as requiring cooling, and the plots would look very similar, only that the V or W (respectively) would be clamped instead of the U phase.

To implement the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table.

An example table for the U phase being cooled is shown below:

| Seg | 0 | 1 | 2 | 3 | 4 | 5 | 6 | 7 | 8 | 9 | 10 | 11 |
|---|---|---|---|---|---|---|---|---|---|---|---|---|
| Phase | U | U | U | U | NC | NC | U | U | U | U | NC | NC |
| Bus | −ve | −ve | −ve | −ve | NC | NC | +ve | +ve | +ve | +ve | NC | NC |

The segments may be chosen to be any number of angles, although preferably they are all the same number of angles with respect to each other. In the preferred implementation, a segment is chosen to have 30°. Phase indicates the phase requiring cooling and Bus indicates the supply rail to which the identified phase is to be clamped by applying the common mode component voltage. "NC" indicates that there is no clamping during that segment. In such segments, the desired modulation technique (for example SVM) is used.

Figure 8:
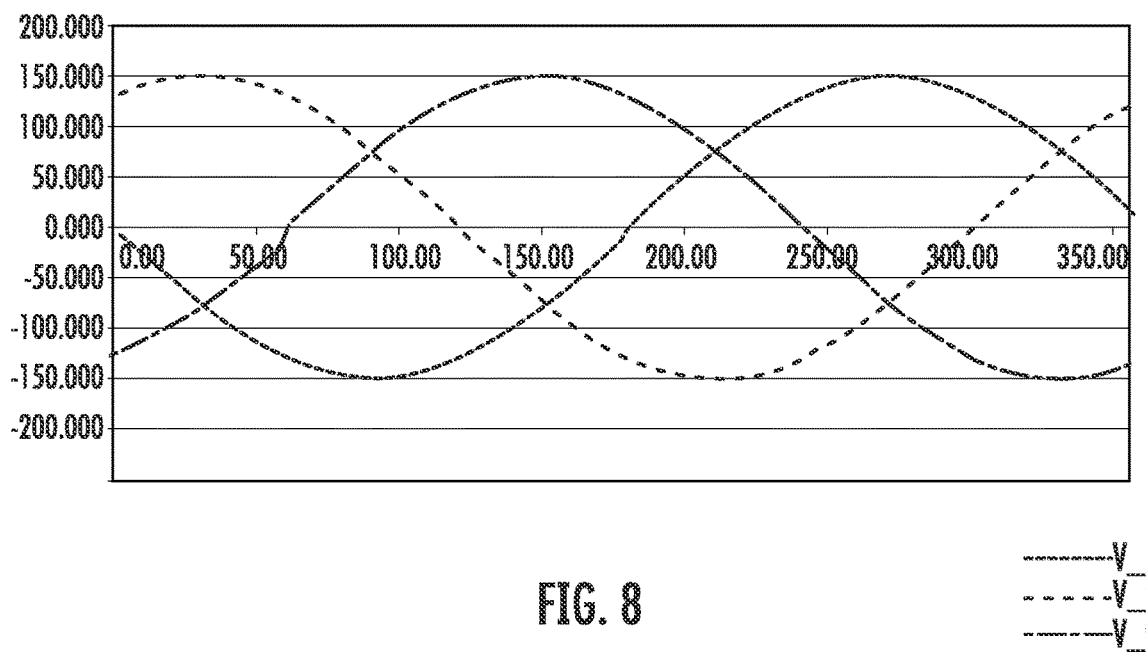
FIG. 8 shows the line-to-line voltages of the plots of FIG. 7.

FIG. 8 shows the line-to-line voltages of the plots of FIG. 7, demonstrating that the output to the electrical load remains unchanged compared to the standard modulation scheme, for example SVM, without the cooling technique.

2. Multi-Phase Cooling

This is also an asymmetric method with respect to the phases, so may control the switching loss and the conduction loss distributions. The aim in this scenario is to cool the switches (so upper and lower) associated with the two identified phases (U and V, or V and W, or U and W). The phase not chosen to be cooled is sometimes referred to as the "hotter" phase, as no additional cooling through modulation is applied.

As with the single-phase scenario, the fundamental principle behind this scenario is that the modulation scheme (for example SVM) is adapted to offset each of the phase AC output voltages of the identified phases when their magnitude is respectively at the most positive of all of the phases or when their magnitude is the most negative of all of the phases. Each of the identified phases is cooled consecutively in turn.

When the first identified phase AC output is the most positive, a common mode component voltage is applied to the that phase AC output to offset, or clamp, the first phase AC output to the positive supply rail. When the second identified phase AC output is the most positive, a common mode component voltage is applied to the that phase AC output to offset, or clamp, the second phase AC output to the positive supply rail.

When the first identified phase AC output is the most negative, a common mode component voltage is applied to the that first phase AC output to offset, or clamp, the first phase AC output to the negative supply rail. When the second identified phase AC output is the most negative, a common mode component voltage is applied to the that second phase AC output to offset, or clamp, the second phase AC output to the negative supply rail.

Preferably the first identified phase is the phase identified as requiring more cooling than the second identified phase.

The common mode component voltage is applied to all phases simultaneously. Whilst the voltage levels for each phase output relative to ground are shifted, the common mode component voltage cancels out between respective line outputs, so the electrical load still sees a (preferably) sinusoidal output voltage.

Figure 9:
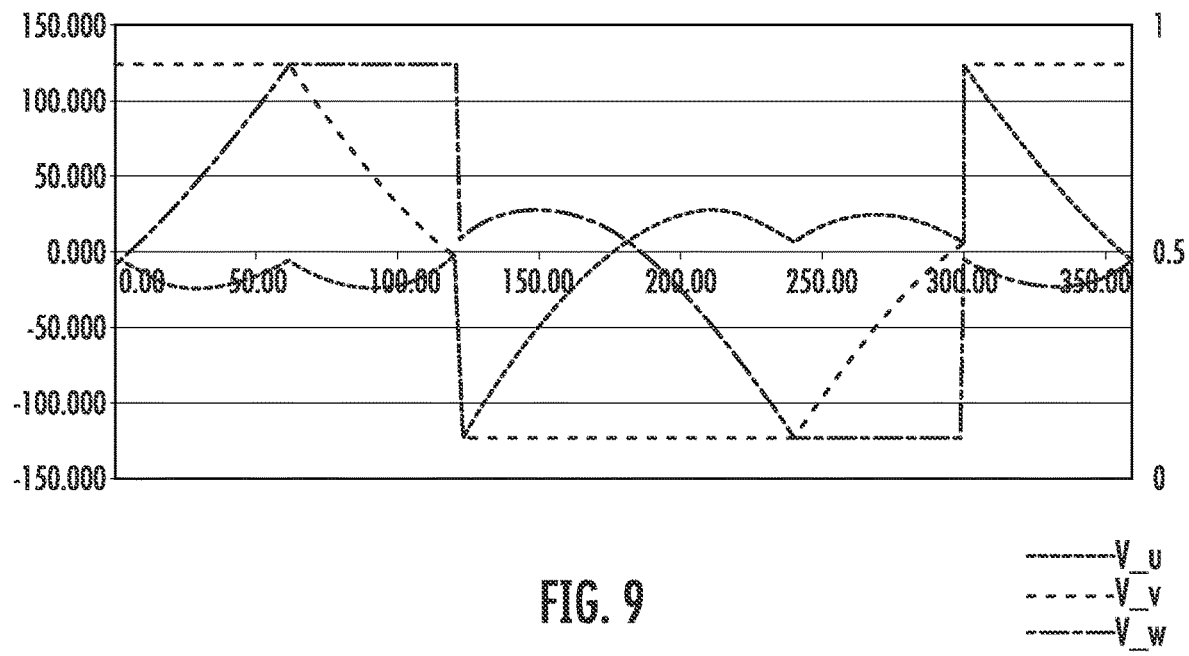
FIG. 9 shows an example output AC voltage plot for a whole waveform cycle for a multi-phase cooling scheme.

FIG. 9 shows an example output AC voltage plot for a whole waveform cycle for a multi-phase cooling scheme. The voltages are with respect to ground for each of the phases.

In this example, one or more of the switches associated with the V and W phases have been identified as requiring cooling. As such, the V phase output AC voltage is clamped for a portion of the waveform cycle alternately to the negative supply rail (when the V phase was approaching the negative supply rail and was the most negative voltage) and the positive supply rail (when the V phase was approaching the positive supply rail and had the most positive voltage) via the application of a common mode component voltage. Furthermore the W phase output AC voltage is clamped for a portion of the waveform cycle alternately to the negative supply rail (when the W phase was approaching the negative supply rail and was the most negative voltage) and the positive supply rail (when the W phase was approaching the positive supply rail and had the most positive voltage) via the application of a common mode component voltage. The common mode component voltage is also applied to the other two phases not being clamped at that particular moment.

Clamping this way thus reduces the switching losses in the switches associated with the V and W phases, and thus those switches will generate less heat compared to the switches associated with the non-cooled phase when this technique is being applied. When one phase is being clamped, the switches of the other phases are controlled to provide the correct output voltage to the electrical load.

As with the single-phase scheme, to implement the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table.

An example table for the V and W phases being cooled is shown below:

| Seg | 0 | 1 | 2 | 3 | 4 | 5 | 6 | 7 | 8 | 9 | 10 | 11 |
| --- | --- | --- | --- | --- | --- | --- | --- | --- | --- | --- | --- | --- |
| Phase | V | V | W | W | V | V | V | V | W | W | V | V |
| Bus | +ve | +ve | +ve | +ve | −ve | −ve | −ve | −ve | −ve | −ve | +ve | +ve |

The segments may be chosen to be any number of angles, although preferably they are all the same number of angles with respect to each other. In the preferred implementation, a segment is chosen to have 30°. Phase indicates the phase requiring cooling and Bus indicates the supply rail to which the identified phase is to be clamped by applying the common mode component voltage. "NC" indicates that there is no clamping during that segment. In such segments, the desired modulation technique (for example SVM) is used.

As can be seen with this scheme, the W phase immediately follows the V phase (albeit phase shifted by 120°), so the clamped portions immediately follow one another.

Figure 10:
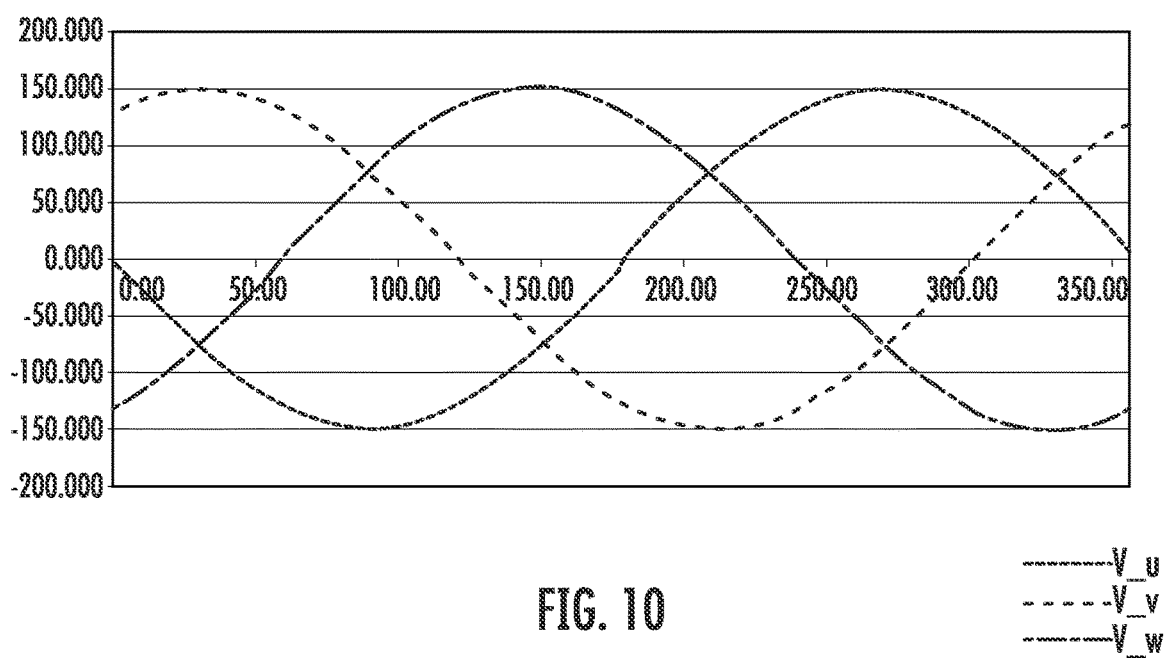
FIG. 10 shows the line-to-line voltages of the plots of FIG. 9.

FIG. 10 shows the line-to-line voltages of the plots of FIG. 9, demonstrating that the output to the electrical load remains unchanged compared to the standard modulation scheme, for example SVM, without the cooling technique.

3. Upper Switch Cooling

This is a symmetric method with respect to the phases, so may only control the conduction loss distributions. The aim in this scenario is to cool the upper switches associated with the one or more identified phases (U, V and W).

As with the multi-phase scenario, the fundamental principle behind this scenario is that the modulation scheme (for example SVM) is adapted to offset each of the identified phase AC output voltages when their magnitude is most positive of all of the phases. Each of the identified phases is cooled consecutively in turn.

When the first identified phase AC output is the most positive, a common mode component voltage is applied to the that phase AC output to offset, or clamp, the first phase AC output to the positive supply rail. When the second identified phase AC output is the most positive, a common mode component voltage is applied to the that phase AC output to offset, or clamp, the second phase AC output to the positive supply rail. When the third identified phase AC output is the most positive, a common mode component voltage is applied to the that phase AC output to offset, or clamp, the third phase AC output to the positive supply rail.

The common mode component voltage is applied to all phases simultaneously. Whilst the voltage levels for each phase output relative to ground are shifted, the common mode component voltage cancels out between respective line outputs, so the electrical load still sees a (preferably) sinusoidal output voltage.

Figure 11:
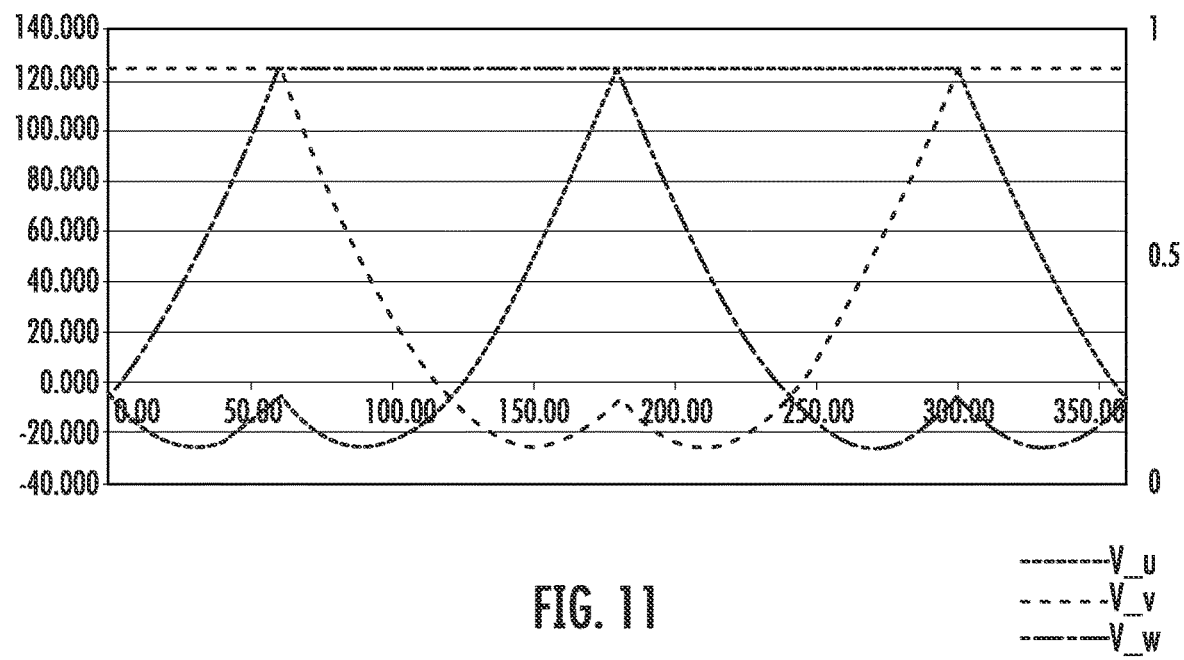
FIG. 11 shows an example output AC voltage plot for a whole waveform cycle for a upper switch cooling scheme.

FIG. 11 shows an example output AC voltage plot for a whole waveform cycle for a upper switch cooling scheme. The voltages are with respect to ground for each of the phases.

In this example, one or more of the upper switches associated with the U, V and W phases have been identified as requiring cooling. As such, the U phase output AC voltage is clamped for a portion of the waveform cycle to the positive supply rail (when the U phase was approaching the positive supply rail and was the most positive voltage) via the application of a common mode component voltage. The V phase output AC voltage is clamped for a portion of the waveform cycle to the positive supply rail (when the V phase was approaching the positive supply rail and had the most positive voltage) via the application of a common mode component voltage. Furthermore the W phase output AC voltage is clamped for a portion of the waveform cycle to the positive supply rail (when the W phase was approaching the positive supply rail and had the most positive voltage) via the application of a common mode component voltage. The common mode component voltage is also applied to the other two phases not being clamped at that particular moment.

Clamping this way thus reduces the switch conduction losses in the switches associated with the U. V and W phases, and thus those switches will generate less heat compared to the switches associated with the non-cooled switches (i.e. the Lowers) when this technique is being applied. When one phase is being clamped, the switches of the other phases are controlled to provide the correct output voltage to the electrical load.

As with the other schemes, to implement the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table.

An example table for the V and W phases being cooled is shown below:

| Seg | 0 | 1 | 2 | 3 | 4 | 5 | 6 | 7 | 8 | 9 | 10 | 11 |
|---|---|---|---|---|---|---|---|---|---|---|---|---|
| Phase | V | V | W | W | W | W | U | U | U | U | V | V |
| Bus | +ve | +ve | +ve | +ve | +ve | +ve | +ve | +ve | +ve | +ve | +ve | +ve |

The segments may be chosen to be any number of angles, although preferably they are all the same number of angles with respect to each other. In the preferred implementation, a segment is chosen to have 30°. Phase indicates the phase requiring cooling and Bus indicates the supply rail to which the identified phase is to be clamped by applying the common mode component voltage.

Figure 12:
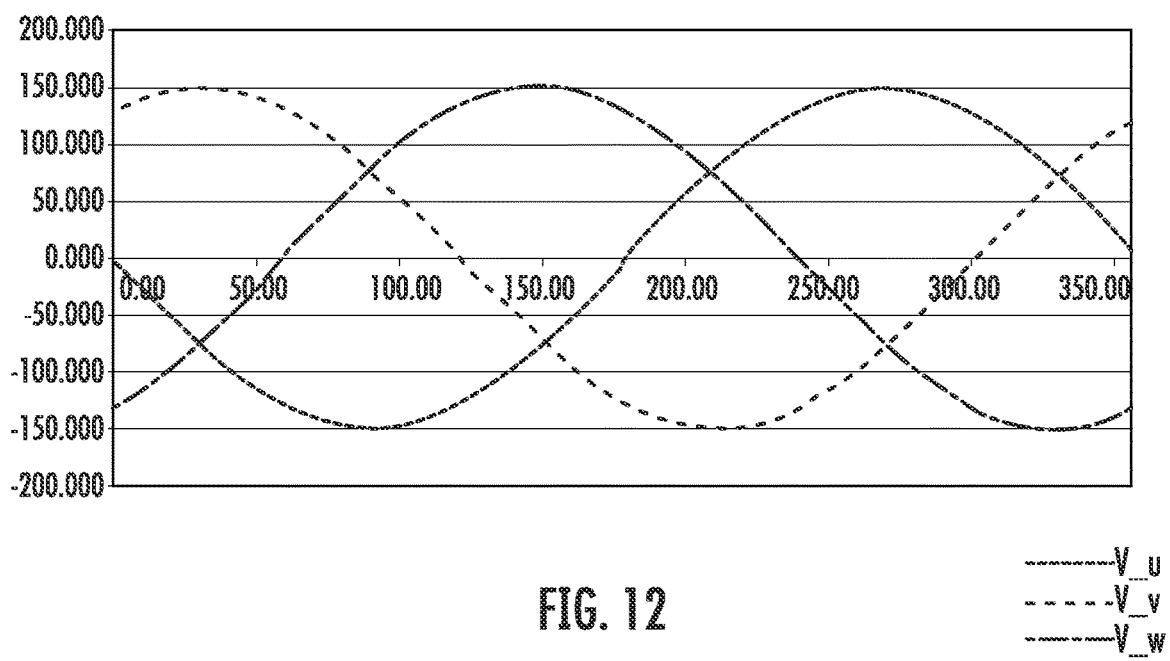
FIG. 12 shows the line-to-line voltages of the plots of FIG. 11.

FIG. 12 shows the line-to-line voltages of the plots of FIG. 11, demonstrating that the output to the electrical load remains unchanged compared to the standard modulation scheme, for example SVM, without the cooling technique.

4. Lower Switch Cooling

This is a symmetric method with respect to the phases, so may only control the conduction loss distributions. The aim in this scenario is to cool the lower switches associated with the one or more identified phases (U, V and W).

As with the multi-phase scenario, the fundamental principle behind this scenario is that the modulation scheme (for example SVM) is adapted to offset each of the identified phase AC output voltages when their magnitude is most negative of all of the phases. Each of the identified phases is cooled consecutively in turn.

When the first identified phase AC output is the most negative, a common mode component voltage is applied to the that phase AC output to offset, or clamp, the first phase AC output to the negative supply rail. When the second identified phase AC output is the most negative, a common mode component voltage is applied to the that phase AC output to offset, or clamp, the second phase AC output to the negative supply rail. When the third identified phase AC output is the most negative, a common mode component voltage is applied to the that phase AC output to offset, or clamp, the third phase AC output to the negative supply rail.

The common mode component voltage is applied to all phases simultaneously. Whilst the voltage levels for each phase output relative to ground are shifted, the common mode component voltage cancels out between respective line outputs, so the electrical load still sees a (preferably) sinusoidal output voltage.

Figure 13:
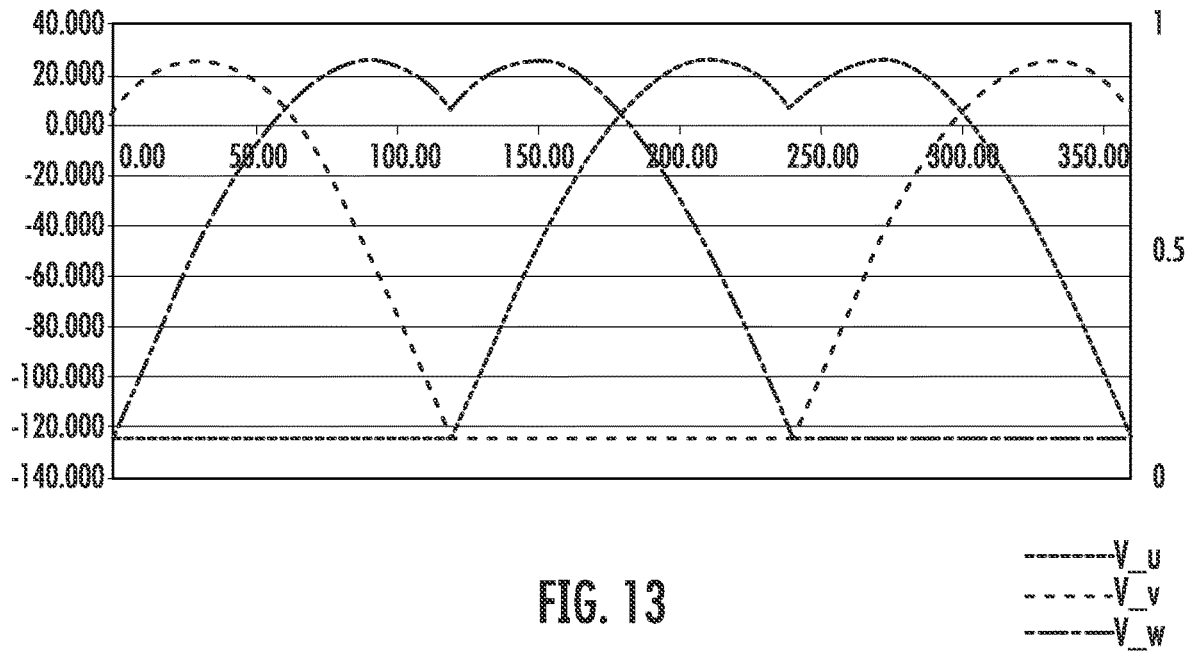
FIG. 13 shows an example output AC voltage plot for a whole waveform cycle for a lower switch cooling scheme.

FIG. 13 shows an example output AC voltage plot for a whole waveform cycle for a lower switch cooling scheme. The voltages are with respect to ground for each of the phases.

In this example, one or more of the lower switches associated with the U, V and W phases have been identified as requiring cooling. As such, the U phase output AC voltage is clamped for a portion of the waveform cycle to the negative supply rail (when the U phase was approaching the negative supply rail and was the most negative voltage) via the application of a common mode component voltage. The V phase output AC voltage is clamped for a portion of the waveform cycle to the negative supply rail (when the V phase was approaching the negative supply rail and had the most negative voltage) via the application of a common mode component voltage. Furthermore the W phase output AC voltage is clamped for a portion of the waveform cycle to the negative supply rail (when the W phase was approaching the negative supply rail and had the most negative voltage) via the application of a common mode component voltage. The common mode component voltage is also applied to the other two phases not being clamped at that particular moment.

Clamping this way thus reduces the switch conduction losses in the lower switches associated with the U, V and W phases, and thus those switches will generate less heat compared to the switches associated with the non-cooled switches (i.e. the uppers) when this technique is being applied. When one phase is being clamped, the switches of the other phases are controlled to provide the correct output voltage to the electrical load.

As with the other schemes, to implement the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table.

An example table for the V and W phases being cooled is shown below:

| Seg | 0 | 1 | 2 | 3 | 4 | 5 | 6 | 7 | 8 | 9 | 10 | 11 |
|---|---|---|---|---|---|---|---|---|---|---|---|---|
| Phase | U | U | U | U | V | V | V | V | W | W | W | W |
| Bus | −ve | −ve | −ve | −ve | −ve | −ve | −ve | −ve | −ve | −ve | −ve | −ve |

The segments may be chosen to be any number of angles, although preferably they are all the same number of angles with respect to each other. In the preferred implementation, a segment is chosen to have 30°. Phase indicates the phase requiring cooling and Bus indicates the supply rail to which the identified phase is to be clamped by applying the common mode component voltage.

Figure 14:
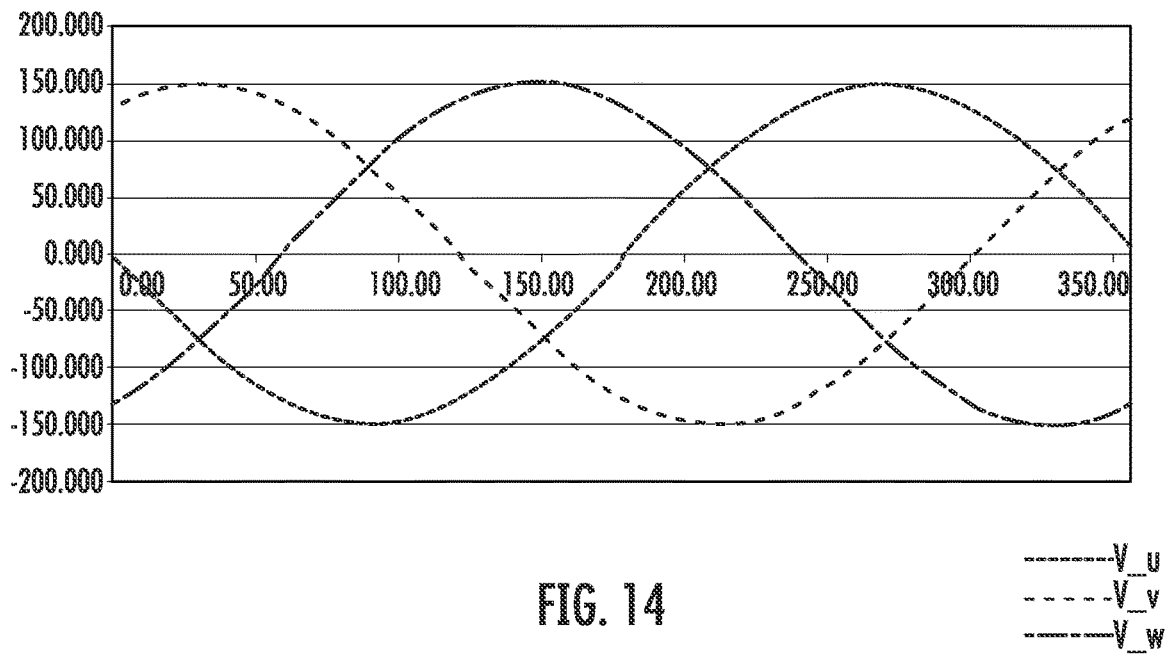
FIG. 14 shows the line-to-line voltages of the plots of FIG. 13.

FIG. 14 shows the line-to-line voltages of the plots of FIG. 13, demonstrating that the output to the electrical load remains unchanged compared to the standard modulation scheme, for example SVM, without the cooling technique.

Benefit

Figure 15:
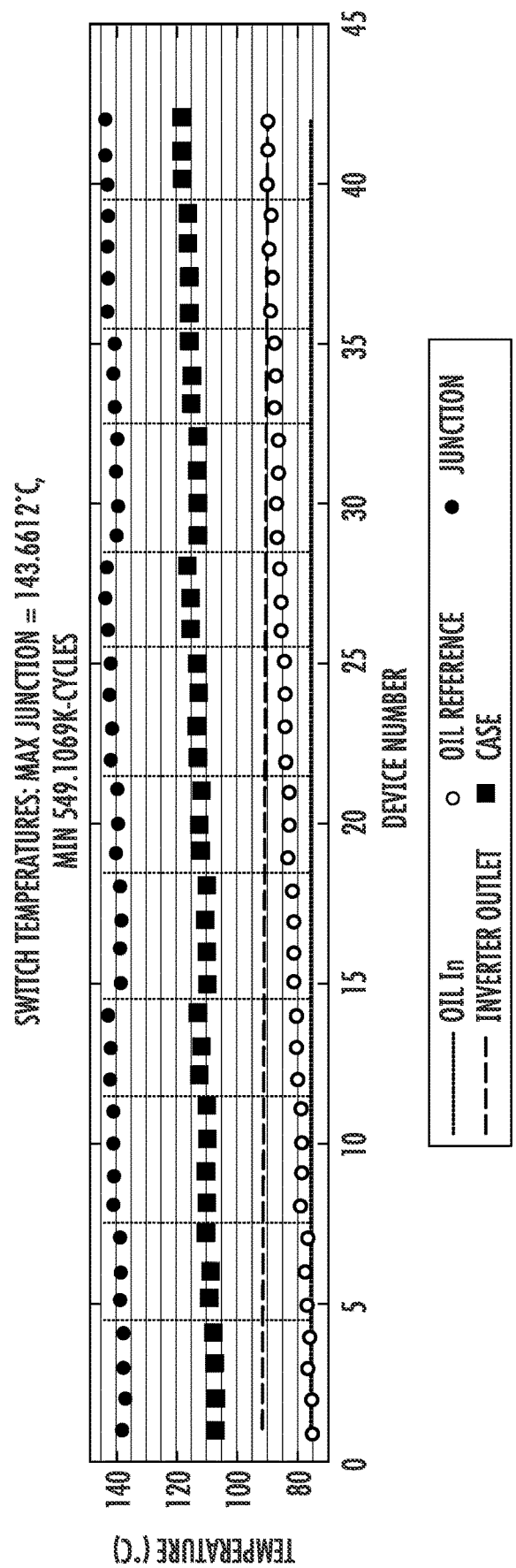
FIG. 15 shows a temperature plot of a plurality of power devices in a chamber flooded with a cooling fluid with a system using the cooling method.

FIG. 15 shows a temperature plot of a plurality of power devices in a chamber flooded with a cooling fluid with a system using the above cooling method.

Figure 6:
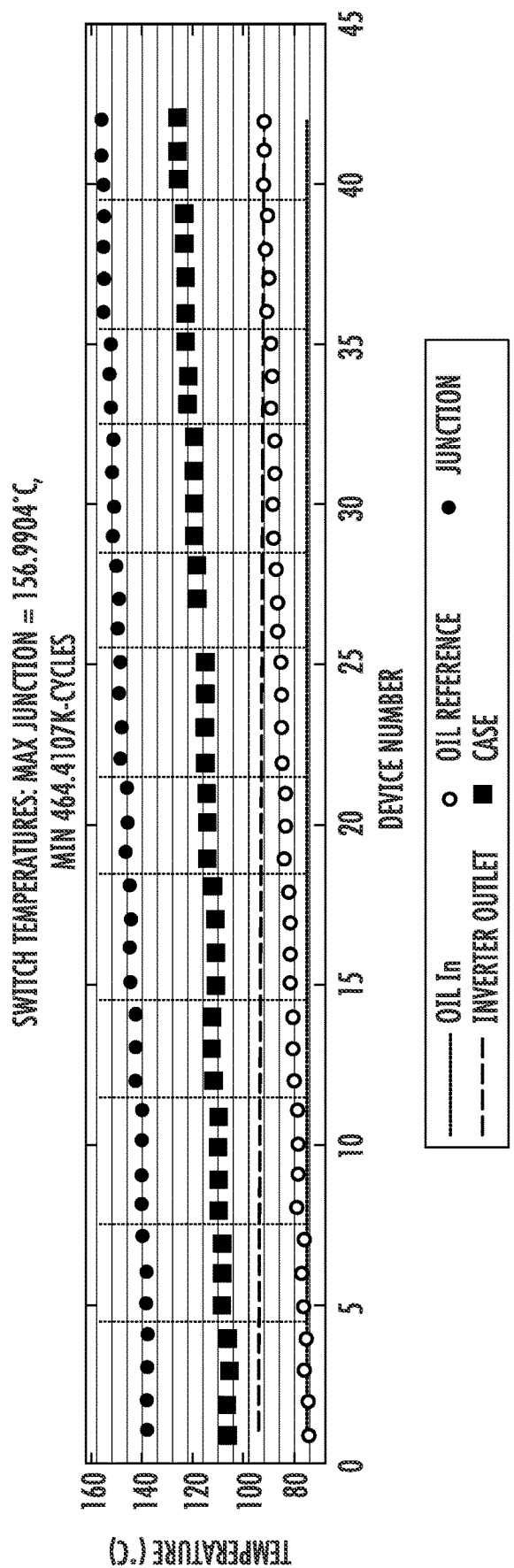
FIG. 6 shows a temperature plot of a plurality of power devices in a chamber flooded with a cooling fluid.

The plot above shows the temperatures of devices as the oil travels from the first bank of 4 devices through the thermal chamber to the last bank of 3 devices under the same conditions as before (with reference to FIG. 6). The vertical dotted lines show the banks as the fluid progresses through the 12 heatsinks starting with 4 devices making up part of the U_upper switch.

In this example, the multi-phase scheme is used where the first priority is the W phase and the second priority is the V phase.

The temperature of the heatsinks increases as the oil heats up as it moves from heatsink to heatsink through the thermal chamber but this change has been reduced due to the shifting of losses.

With SVM, the hottest devices are on the last heatsink to see fluid and are at a junction (die) temperature of ~157° C. The spread of temperatures is from ~138° C. to ~157° C. so ~19° C.

The method has reduced the spread from 19° C. to 6° C. and reduced the maximum junction temperature from 157° C. to 144° C. under the same conditions.

Slew Control

Clamping methods, such as those in the prior art or those described above may result in increased Noise. Vibration and Harshness (NVH) and EMI due to sharp edges introduced into the output AC voltages when clamping to either of the positive and negative supply rails. Generally it is the transitions between the underlying modulation technique (for example SVM) and the supply rail that cause the NVH and EMI. We have therefore appreciated the need for an improved method of generating a three-phase AC output voltage when using such a clamping technique. This has been discussed in our co-pending application filed on the same day.

In brief, we describe a modulation technique in which, when a controller modulates the output AC voltages to introduce an offset to the phase that is most positive or most negative such that the phase is clamped to the +dc supply when the respective phase is most positive and to the −dc supply rail when most negative, the common mode component voltage amplitude is varied over the output angles within the respective segment between a minimum and a maximum in order to control a slew rate of the rising or falling edges of the three phase AC output voltages. By adjusting the common mode component voltage in this way, this may reduce the NVH and EMI, as this technique introduces a slew to the rising and falling edges of the AC output voltages, this reduces the NVH and EMI as the harsh transitions to the supply rails are softened.

Figure 16:
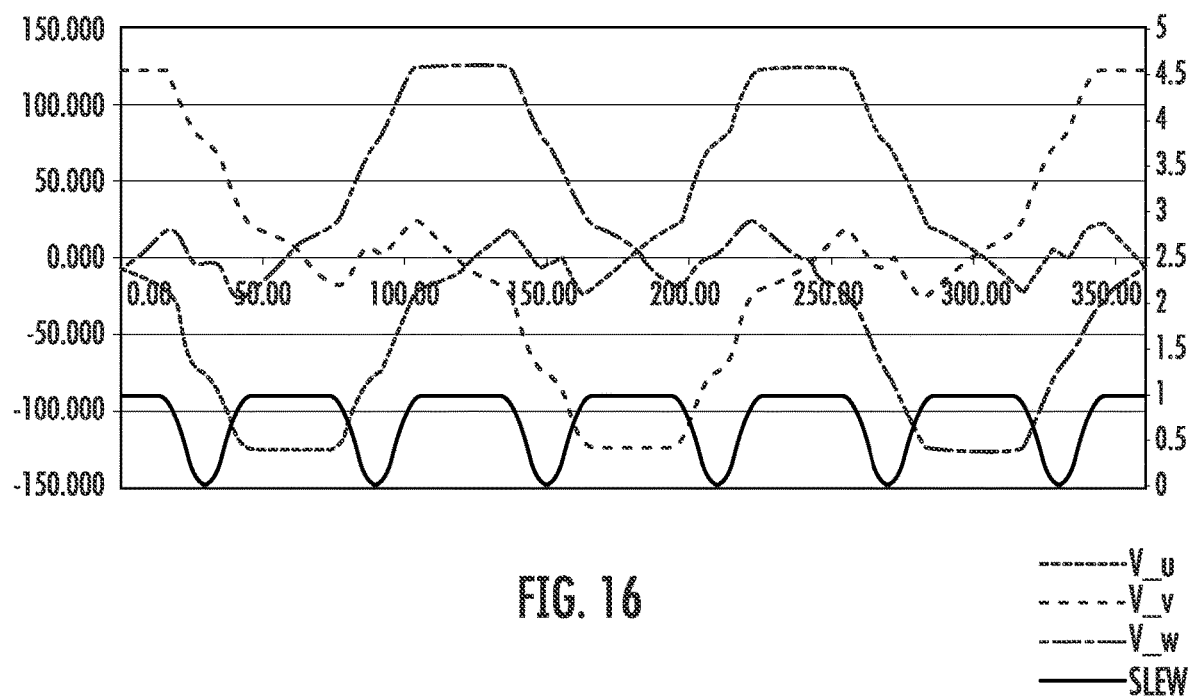
FIG. 16 illustrates the output AC voltages when using the Slew Controlled Edge Reduction (SCER) technique

FIG. 16 illustrates the output AC voltages when using the new modulation technique, which we shall refer to as Slew Controlled Edge Reduction (SCER). In this figure, the U phase is being modulated such that, when it is the most positive voltage between all the phases, a common mode component voltage is applied such that it is clamped at the positive supply rail for a portion of the output angle, and when it is the most negative voltage between all the phases, a common mode component voltage is applied such that it is clamped at the negative supply rail for a portion of the output angle. Similarly, the common mode component voltage is applied to the V and W phases when they become the most positive phase and the most negative phase such that they are also clamped respectively to the positive or negative supply rail for a portion of the output angle.

As can be seen from FIG. 16, the common mode component voltage is varied by use of a Slew Value, which is a scalar factor varying between 0 (where the common mode component voltage is 0) and 1 (where the common mode component voltage is fully used). Varying the Slew Value over the output angle thus enables the amount of common mode component voltage to be varied over the output angle. As such, one may choose the output angles over which the common mode component voltage is fully on (and thus a respective output phase voltage is clamped to the respective supply rail), the output angles over which the common mode component voltage is off (and thus the modulation scheme resorts to the underlying scheme being used without clamping, for example SVM or other modulation schemes) and over how many degrees of angle the common mode component voltage is changed from minimum to maximum or vice versa.

As such the SCER technique enables the rising and falling edges between the underlying modulation scheme (for example SVM) and the clamping scheme (where the output voltages are clamped in turn to the positive and negative supply rails) to be softened to reduce the NVH and EMI issues often associated with the pure clamping technique.

As can be seen, there is a trade-off between the time spent by the output AC voltages at the positive and negative supply rails, which affects the reduction in switching losses, and the time spent getting to the supply rail, which affects the NVH and EMI.

The Slew Value (and thus the common mode component voltage) may be varied over the output AC voltage angles using any shape as desired by the intended purpose of the technique. For example, the transition of the slew value (and thus the common mode component voltage between its minimum and maximum) may occur linearly, exponentially, or logarithmically. The transition of the slew value (and thus the common mode component voltage between its minimum and maximum) may even take the shape of a portion of a circular function.

Through modulation and experimentation, it has been found that the preferred shape of the transition between the minimum and maximum values of slew value (and thus the common mode component voltage) is an S shape based on a sinusoid. This shape gives the best reduction of sharp edges in the transition (thus minimising the rise in NVH and EMI) whilst stiller permitting the maximum time with the phase clamped at the supply rails (thus reducing the switching losses for that particular phase).

We will now describe the preferred shape of the Slew Value (and thus common mode component voltage amplitude) over the output AC voltage angles using the SCER technique.

Clamping any one of the phases to the positive supply rail or negative supply rail means that the other phases need also to be raised or lowered in amplitude appropriately in order that the line to line voltage remains sinusoidal for the electrical load.

$$V u = \sin(\theta) + V c$$

$$V v = \sin(\theta + 120°) + V c$$

$$V w = \sin(\theta + 240°) + V c$$

Where $V_u$ is the U phase voltage at a particular angle, $V_v$ is the V phase voltage at a particular angle (phase shifted by 120° from the U phase) and $V_w$ is the W phase voltage at a particular (phase shifted by 240° from the U phase). $V_c$ is the common mode component voltage.

If we want $V_u$ to be equal to the positive DC supply rail, then we set $V_c$ to a value that will make up the difference.

$$V c = (\sin(\theta) + V_{DC}) * \text{SlewValue}$$

Where $V_{DC}$ is the DC supply rail voltage. This equation shows the value of $V_{DC}$ when clamping to the positive supply rail. When clamping to the negative supply rail, the $V_{DC}$ value for the negative supply rail is subtracted.

As discussed above, the Slew Value is a scalar value between 0 and 1 that allows control of the amplitude of $V_c$ that is applied at any particular point throughout the output AC voltage angles.

To determine the common component's value, we can utilise the following inputs:
Electrical angle θ
$V_U$, $V_V$ and $V_W$ values (as calculated by SVM)
DC bus voltages, $V_{DC+ve}$ and $V_{DC-ve}$
The definition of the clamping function we have selected:
  Which phase should be clamped in a given sector?
    None, U, V or W?
  Where should the clamped phase be clamped to? No clamp, DC+ve or DC−ve?

What is the scalar (i.e. slew value) applied to the common component?0%, 100%, rising over time, or falling over time?

For each method, we can create a table to map each of the last three inputs for each 30-degree sector of the output AC voltage angle, for example as shown below:

| Sector | 0 | 1 | 2 | 3 | 4 | 5 | 6 | 7 | 8 | 9 | 10 | 11 |
|---|---|---|---|---|---|---|---|---|---|---|---|---|
| Phase | V | U | U | W | W | V | V | U | U | W | W | V |
| Bus | +ve | −ve | −ve | +ve | +ve | −ve | −ve | +ve | +ve | −ve | −ve | +ve |
| Slew | Fall | Rise | Fall | Rise | Fall | Rise | Fall | Rise | Fall | Rise | Fall | Rise |

Whilst in this method the output AC voltage angles have been split into 30° segments, it would be appreciated by the skilled reader that other segment sizes may be possible. However, in this case, 30° segments were chosen as the method become simpler to implement.

The Slew value being stated as "Rise" indicates that the slew value for that segment is rising from a lower value to a higher value over at least a portion of that segment, and "Fall" indicates that the slew value for that segment is falling from a higher value to a lower value over at least a portion of that segment.

Over the rise segments, the slew value may be shaped as desired, as discussed above. Preferably, the shape of the rise segment is defined by a portion of a circular function, preferably at least a rising portion of a sinusoid. Over the fall segments, the slew value may be shaped as desired, as discussed above. Preferably, the shape of the fall segment is defined by a portion of a circular function, preferably at least a falling portion of a sinusoid.

The angle of operation of the output AC voltage within a 30° segment is determined. This can, for example, be found by using the following operation:

$$\gamma = \mathrm{mod}\left(\frac{\theta}{30}\right)$$

Identifying which of the 30° segments we are operating in can be determined by:

$$\mathrm{Sector} = \frac{\theta}{30} - \gamma$$

From the table above, it can then be determined which operation to perform on the Slew Value (0%, 100%, rise or fall). If the Slew Value is required to stay at 0% (equivalent to SVM), then the Slew Value is set to 0, if the Slew Value is required to stay at 100% (equivalent to bus clamped or the temperature balanced method as described above), then the Slew Value is set to 1.

If the Slew Value is required to "Rise", the Slew Value is required to rise from a lower value to its maximum value over a portion of the segment, and then remain at the maximum value for the remainder of the segment. The following rules are provided, depending on the operating angle within the segment:
  If a product of the angle of operation and a Slew Factor is less than 30°, then increase the Slew Value according to the desired shape
  If a product of the angle of operation and the Slew Factor is greater than 30°, then set the Slew Value to 1 (i.e. 100%)

The Slew Factor is a further scalar value, which enables control over the duration of the rise and fall within the segment.

For a rise operation, the preferred shape may be represented as:

$$\mathrm{SlewValue} = -0.5 * \cos(6 * (\mathrm{Slew}_{Factor} * \gamma)) + 0.5$$

As can be seen, at its heart, the Slew Value's shape is defined by a circular function having a fundamental frequency that is 6 times the frequency of the output AC voltage. The Slew Factor provides control over its period such that the rate at which the function causes the Slew Value (and thus the common mode component voltage) to rise.

It would be apparent to the skilled reader that this Slew Value may be represented mathematically in other ways, whilst still achieving the same result.

If the Slew Value is required to "Fall", the Slew Value is required to start at its maximum value for a portion of the segment, and then fall from its maximum value to a lower value over the remaining portion of the segment. The following rules are provided, depending on the operating angle within the segment:
  If the operating angle is less than a "Slew Offset", which is used to define the starting angle of the falling portion within the segment, then the Slew Value is held at its maximum
  If the operating angle is greater than the "Slew Offset", then decrease the Slew Value according to the desired shape The Slew Offset defines the starting angle and/or duration of the falling portion, and is proportional to the Slew Factor. The Slew Offset may be defined for the scheme using 30° segments as:

$$\mathrm{Slew}_{Offset} = 30° - \frac{30°}{\mathrm{Slew}_{factor}}$$

For a fall operation, the preferred shape may be represented as:

$$\mathrm{Slew} = 0.5 * \cos(6 * \mathrm{Slew}_{Factor} * (\gamma - \mathrm{Slew}_{Offset})) + 0.5$$

As can be seen, at its heart, the Slew Value's shape over the fall function is defined by a circular function having a fundamental frequency that is 6 times the frequency of the output AC voltage. The Slew Factor provides control over its period such that the rate at which the function causes the Slew Value (and thus the common mode component voltage) to fall. The Slew Offset provides a variable phase shift, dependent on the Slew Factor.

Again, it would be apparent to the skilled reader that this Slew Value may be represented mathematically in other ways, whilst still achieving the same result.

In any of the rise or fall operations, the Slew Factor value may be chosen depending on a number of factors, for example the intended modulation index of the inverter and/or the operating frequency of the output AC voltages. Characterisation of the electrical load may be performed under different operating conditions to identify operating points at which implementing the above mentioned SCER technique would provide maximum benefit. From the characterisation, a table of Slew Factors may be collated and referenced during operation of the electrical load as either a lookup table or other referencing methods.

Similarly, whether or not to implement the SCER technique may be based on knowledge of the operating point of the electrical load, the modulation index of the inverter and/or the frequency of the output AC voltage. This could be determined from real-time measurements, or based on a lookup scheme from a table of characterised operating values of the electrical load. Transitioning between SCER or SVM (or whatever underlying modulation scheme is being used) may be performed on a PWM period by PWM period basis if required. Furthermore, the technique is also usable in modulation indices that are greater than one.

FIG. 17 shows the spectrum of the star point measured common mode current for frequencies between 0 Hz and 25 kHz for a system using SVM, a prior art bus clamping technique and the SCER technique described above at a modulation index of 0.82. SVM is shown in black for reference. OG (in blue) is the prior art bus clamp techniques. SCER (slew controlled edge reduction) is shown in orange. As can be seen, a large amount of noise is present around 1.2 kHz in the plot for the prior art bus clamping techniques, whereas there is no noticeable increase in the noise for the same frequencies using the SCER technique. The noise levels appear similar to those of standard SVM modulation schemes, but whilst providing the benefit of a reduction in the switching losses since the phases in turn are clamped at the respective supply rails.

FIG. 18 shows the spectrum of the star point as in 17, but for a lower modulation index, in this case 0.74. FIG. 19 shows the spectrum of the star point as in 17, but for a higher modulation index, in this case 0.94. As can be seen in both cases, the noise levels for the prior art bus clamping technique has elevated noise levels around the 1.2 kHz frequencies, whereas the SCER technique described above has a noise level similar to that of standard SVM, but whilst still providing the benefit of a reduction in the switching losses since the phases in turn are clamped at the respective supply rails.

The SCER technique also reduces coincident switching which in turn helps reduce EM emissions.

In experimentation and simulation it has been observed that the SCER technique achieves a 30% reduction in switching loss (compared to 33% in prior art bus clamping methods) but with very low effect on NVH (the disadvantage of prior art methods).

As such, the four temperature balancing or cooling schemes described above may be adapted as follows to utilise the advantages of the SCER technique described above.

1. Single-Phase (U)

As above, the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table. Adapting the modulation scheme table to implement the SCER technique may be performed as follows (in this example the U phase is being cooled):

| Seg | 0 | 1 | 2 | 3 | 4 | 5 | 6 | 7 | 8 | 9 | 10 | 11 |
| --- | --- | --- | --- | --- | --- | --- | --- | --- | --- | --- | --- | --- |
| Phase | U | U | U | U | NC | NC | U | U | U | U | NC | NC |
| Bus | −ve | −ve | −ve | −ve | NC | NC | +ve | +ve | +ve | +ve | NC | NC |
| Slew | Rise | 100% | 100% | Fall | 0% | 0% | Rise | 100% | 100% | Fall | 0% | 0% |

As above, 30° segments have been chosen, although they need not be this angle. Phase indicates the phase requiring cooling and Bus indicates the supply rail to which the identified phase is to be clamped by applying the common mode component voltage. "NC" indicates that there is no clamping during that segment. In such segments, the desired modulation technique (for example SVM) is used. Slew refers to the Slew Value used in the application of the common mode component voltage using the SCER technique, where 100% is fully used (i.e. value 1), 0% is off, "Rise" refers to the rising slew value, and "fall" refers to the falling slew value (as discussed above with reference to the SCER technique.

2. Multi-Phase (V, W)

As above, the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table. Adapting the modulation scheme table to implement the SCER technique may be performed as follows (in this example the V and W phases are being cooled):

| Segr | 0 | 1 | 2 | 3 | 4 | 5 | 6 | 7 | 8 | 9 | 10 | 11 |
| --- | --- | --- | --- | --- | --- | --- | --- | --- | --- | --- | --- | --- |
| Phase | V | V | W | W | V | V | V | V | W | W | V | V |
| Bus | +ve | +ve | +ve | +ve | −ve | −ve | −ve | −ve | −ve | −ve | +ve | +ve |
| Slew | 100% | 100% | 100% | Fall | Rise | 100% | 100% | 100% | Fall | Rise | 100% | 100% |

As above, 30° segments have been chosen, although they need not be this angle. Phase indicates the phase requiring cooling and Bus indicates the supply rail to which the identified phase is to be clamped by applying the common mode component voltage. Slew refers to the Slew Value used in the application of the common mode component voltage using the SCER technique, where 100% is fully used (i.e. value 1), 0% is off, "Rise" refers to the rising slew value, and "fall" refers to the falling slew value (as discussed above with reference to the SCER technique.)

3. Cool Uppers

As above, the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table. Adapting the modulation scheme table to implement the SCER technique may be performed as follows (in this example the Uppers of each of the U, V and W phases are being cooled):

| Seg   | 0    | 1    | 2    | 3    | 4    | 5    | 6    | 7    | 8    | 9    | 10   | 11   |
|-------|------|------|------|------|------|------|------|------|------|------|------|------|
| Phase | V    | V    | W    | W    | W    | W    | U    | U    | U    | U    | V    | V    |
| Bus   | +ve  | +ve  | +ve  | +ve  | +ve  | +ve  | +ve  | +ve  | +ve  | +ve  | +ve  | +ve  |
| Slew  | 100% | 100% | 100% | 100% | 100% | 100% | 100% | 100% | 100% | 100% | 100% | 100% |

As above, 30° segments have been chosen, although they need not be this angle. Phase indicates the phase requiring cooling and Bus indicates the supply rail to which the identified phase is to be clamped by applying the common mode component voltage. Slew refers to the Slew Value used in the application of the common mode component voltage using the SCER technique, where 100% is fully used (i.e. value 1) (as discussed above with reference to the SCER technique.)

4. Cool Lowers

As above, the modulation scheme a table may be created to map each of the last three inputs for each of any given angular segment, and the appropriate condition may be selected based on the segment of operation, which phase is to be clamped, and to which supply rail. The switches may be controlled appropriately based on the data retrieved from the table. Adapting the modulation scheme table to implement the SCER technique may be performed as follows (in this example the Uppers of each of the U. V and W phases are being cooled):

| Seg   | 0    | 1    | 2    | 3    | 4    | 5    | 6    | 7    | 8    | 9    | 10   | 11   |
|-------|------|------|------|------|------|------|------|------|------|------|------|------|
| Phase | U    | U    | U    | U    | V    | V    | V    | V    | W    | W    | W    | W    |
| Bus   | −ve  | −ve  | −ve  | −ve  | −ve  | −ve  | −ve  | −ve  | −ve  | −ve  | −ve  | −ve  |
| Slew  | 100% | 100% | 100% | 100% | 100% | 100% | 100% | 100% | 100% | 100% | 100% | 100% |

As above, 30° segments have been chosen, although they need not be this angle. Phase indicates the phase requiring cooling and Bus indicates the supply rail to which the identified phase is to be clamped by applying the common mode component voltage. Slew refers to the Slew Value used in the application of the common mode component voltage using the SCER technique, where 100% is fully used (i.e. value 1) (as discussed above with reference to the SCER technique.)

Figure 1:
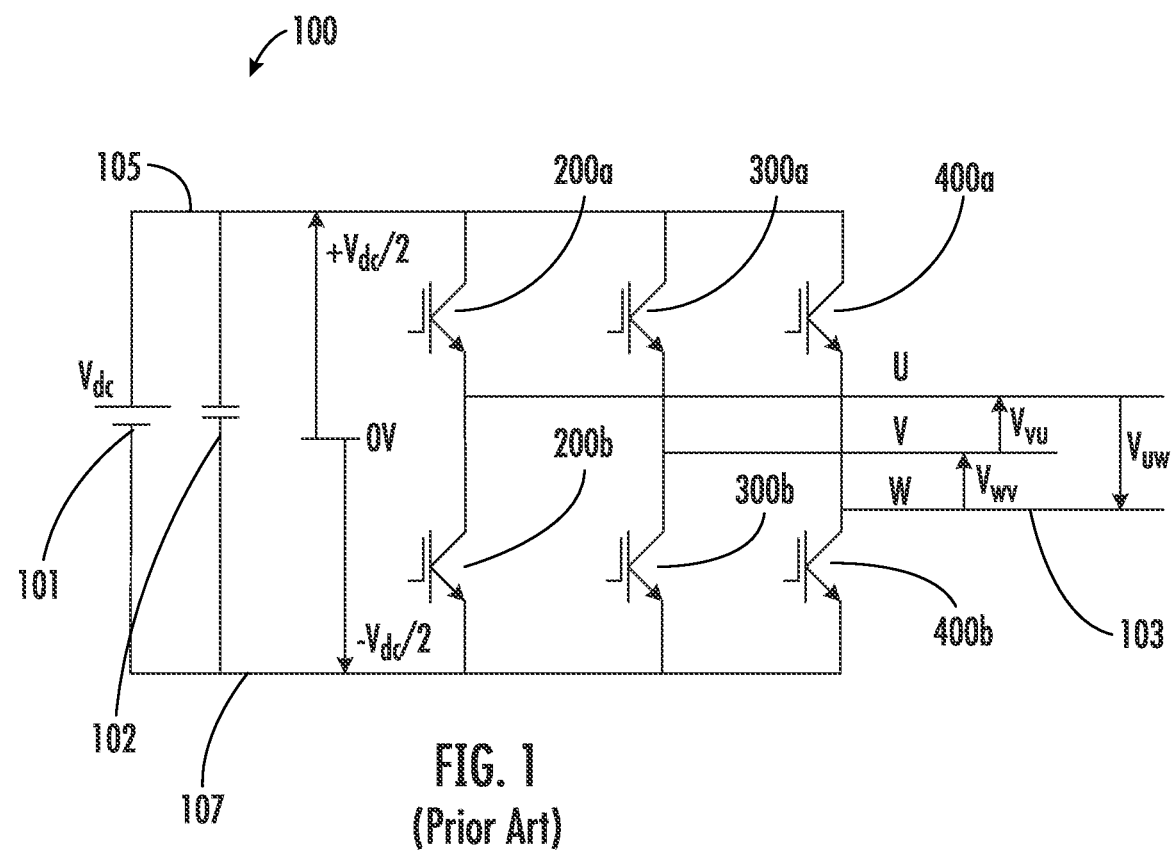
FIG. 1 shows a simplified schematic of an inverter.
Figure 2:
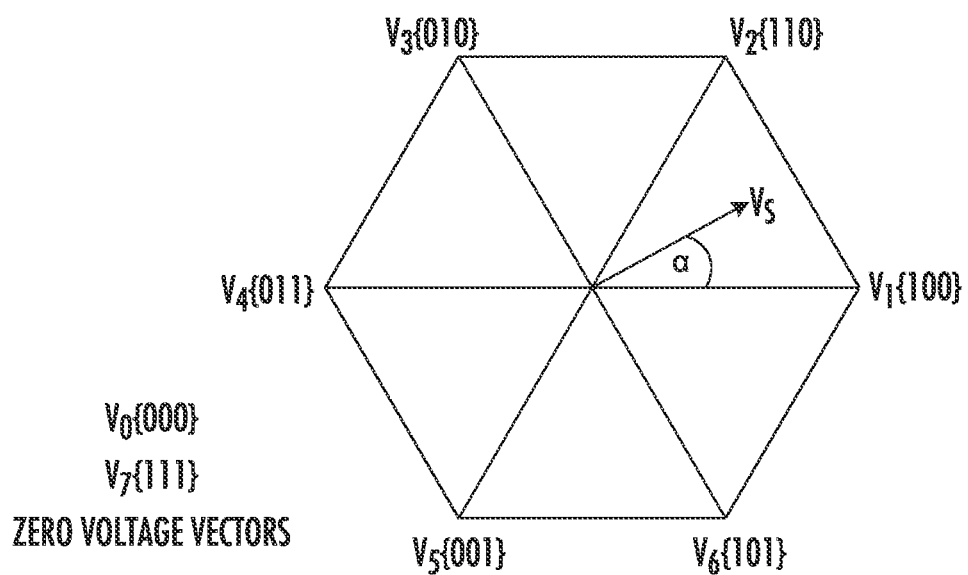
FIG. 2 shows a vector representation of the switching states of the inverter of FIG. 1.
Figure 3:
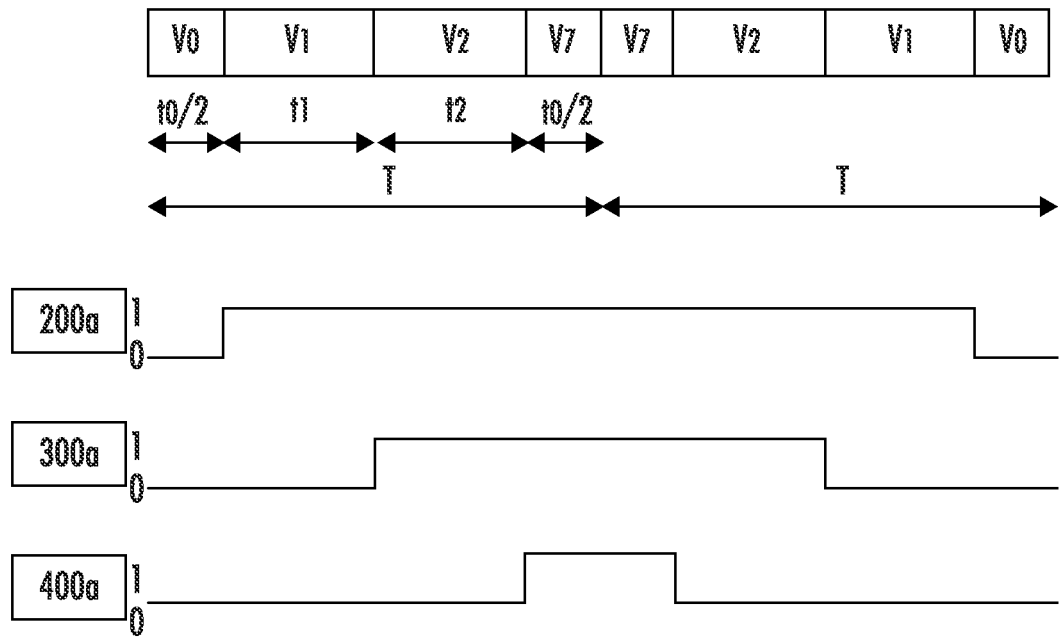
FIG. 3 shows an example of pulse width Space Vector Modulation (SVM) over one Pulse Width Modulation switching cycle.
Figure 4:
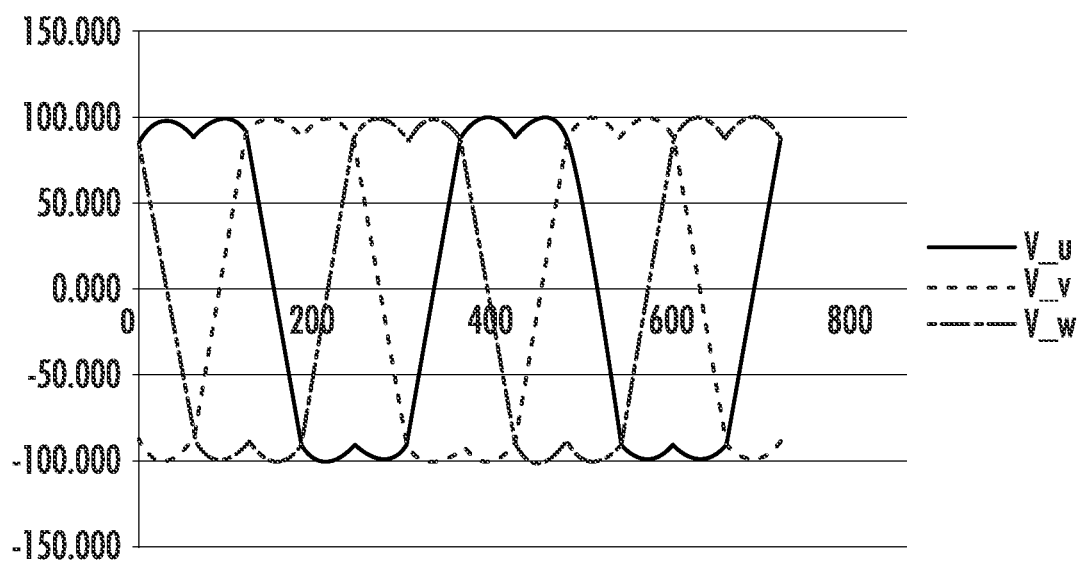
FIG. 4 shows phase voltages (with respect to the 0V line) at the output of the inverter of FIG. 1.
Figure 5:
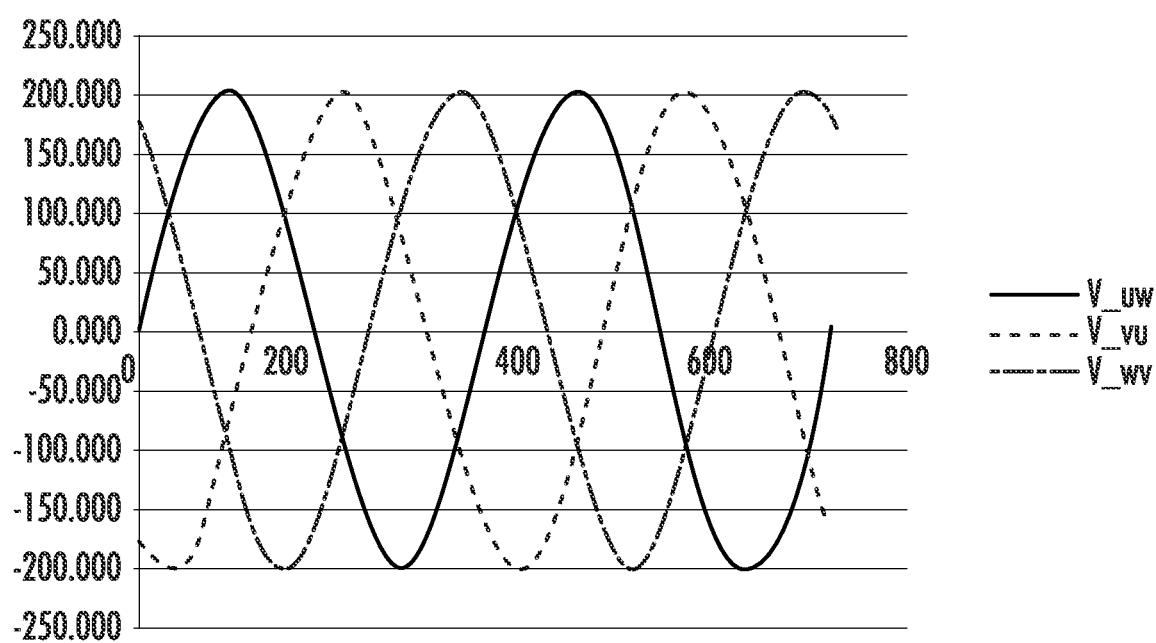
FIG. 5 shows the resulting line to line voltages at the output of the inverter of FIG. 1 as seen by the electrical load.

All of the above methods may be implemented in a controller, in hardware or software, coupled to the controllable switches as shown for example in FIG. 1. However, such a controller is not limited to the physical arrangement of switches in FIG. 1. For example, whilst FIG. 1 is a simplified prior art converter/inverter on which the above-mentioned modified method may be implemented, it is noted that this method is also applicable to multi-level converters, that is, converters having more than the two DC voltages shown in FIG. 1.

In any of the above, electrical load can be taken to mean a multi-phase electrical load. One such example is an electrical motor or an electrical generator, although the temperature balancing scheme and the SCER technique are applicable to any kind of multi-phase electrical load.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A method of cooling one or more power devices, the one or more power devices being arranged as a plurality of switches configured to generate a three phase AC output, the method comprising:
   receiving an input voltage from a voltage source and controlling the plurality of switches, using Pulse Width Modulation (PWM) over a plurality of PWM periods, to generate the three phase AC output for an electrical load, the input voltage having a positive supply rail voltage and a negative supply rail voltage, each phase of the three phase AC output having one or more upper switches connected to the positive supply rail voltage and one or more lower switches connected to the negative supply rail voltage, each voltage of each of three phases of the three phase AC output having an amplitude and angle that varies over a plurality of segments, each segment representing a period of angular position, and wherein each voltage of each phase of the three phase AC output is offset from one another in angle;
   receiving power device stress data, the power device stress data indicating one or more operating parameters of one or more of: one or more of the plurality of power devices, one or more of the switches, and the electrical load;
   identifying from the received power device stress data which one or more of the switches requires cooling;
   identifying a respective one or more phases associated with the one or more of the identified switches requiring cooling;
   controlling the plurality of switches to apply a common mode component voltage to each phase of the three phase AC output for at least a portion of one or more of the plurality of segments,
   wherein the common mode component voltage has a maximum amplitude that is sufficient to clamp a phase AC output voltage of each of the respective identified one or more phases associated with the one or more identified switches requiring cooling, to one or both of the positive supply rail voltage and the negative supply rail voltage when the phase AC output voltage of each of the respective identified one or more phases is approaching respectively the positive supply rail voltage or the negative supply rail voltage,
   wherein clamping the phase AC output voltage of each of the respective identified one or more phases to the respective power rail cools the identified one or more of the plurality of switches, and wherein, when the identified one or more of the plurality of switches requiring cooling comprises one or more switches from a single identified phase of the three phases, the maximum amplitude of the common mode component voltage within the respective segment is sufficient to clamp the phase AC output voltage of each of the respective identified one or more phases associated with the one or more switches requiring cooling to one or both of the positive supply rail voltage and the negative supply rail voltage when the phase AC output voltage of each of the respective identified one or more phases is approaching respectively the positive supply rail voltage or the negative supply rail voltage.

2. The method according to claim 1, wherein, when the one or more of the identified switches requiring cooling comprise a first one or more switches from a first identified single phase of the three phases and second one or more switches from a second identified single phase of the three phases, the maximum amplitude of the common mode component voltage within the respective segment is sufficient to clamp the first identified single phase's AC output voltage to one or both of the positive supply rail voltage and the negative supply rail voltage when the first identified single phase's AC output voltage is approaching respectively the positive supply rail voltage or the negative supply rail voltage, and wherein the maximum amplitude of the common mode component voltage within the respective segment is sufficient to clamp the second identified single phase's AC output voltage to one or both of the positive supply rail voltage and the negative supply rail voltage when the second identified single phase's AC output voltage is approaching respectively the positive supply rail voltage or the negative supply rail voltage.

3. The method according to claim 1, wherein, when the identified switches requiring cooling comprise one or more upper switches from one or more respective phases, the maximum amplitude of the common mode component voltage within the respective segment is sufficient to clamp the respective phase AC output voltage associated with the respective identified one or more upper switches to the positive supply rail voltage.

4. The method according to claim 1, wherein, when the identified switches requiring cooling comprise one or more lower switches from one or more respective phases, the maximum amplitude of the common mode component voltage within the respective segment is sufficient to clamp the respective phase AC output voltage associated with the respective identified one or more lower switches to the negative supply rail voltage.

5. The method according to claim 1, wherein the power device stress data comprises one or more of an output current for one or more phase AC outputs, a temperature of one or more of the power devices, a temperature of one or more of the switches, an operating condition of the electrical load.

6. The method according to claim 1, wherein the common mode component voltage is varied over the angle within the respective segment between the minimum value and the maximum value using a slew value, the slew value comprising a variable scalar value ranging between a respective minimum slew value and a respective maximum slew value within the respective segment.

7. The method according to claim 6, wherein the transition of the slew value between its minimum and maximum values has a shape defined by a portion of a circular function.

8. The method according to claim 7, wherein the duration of the first section of the segment is based on a Slew Factor, the Slew Factor being a scalar value to control the duration of the transition between the minimum and maximum values.

9. The method according to claim 8, wherein the slew value over the first section is defined by:

$$SlewValue=-0.5*\cos(6*(SlewFactor*\gamma))+0.5$$

where $\gamma$ defines the AC output voltage angular position.

10. The method according to claim 7, wherein, for an AC output voltage angular position within a first section of the respective segment, the segment having 30° of angular positions, the slew value has a maximum value for the first section.

11. The method according to claim 10, wherein, the slew value has a shape defined by a falling portion of a sinusoid between its maximum value and its minimum value over the second section, wherein the first and second sections are consecutive.

12. The method according to claim 11, wherein the duration of the second section is based on a Slew Factor, the Slew Factor being a scalar value to control the duration of the transition between the minimum and maximum values.

13. The method according to claim 12, wherein slew value is defined by:

$$SlewValue=0.5*\cos(6*(SlewFactor*(\gamma-SlewOffset)))+0.5$$

where $\gamma$ defines the AC output voltage angular position, and SlewOffset is a starting angle of the second section.

14. An inverter for generating a three phase AC output voltage for powering an electrical load, the inverter comprising:

an input for receiving input voltages, the input voltages having a positive supply rail voltage and a negative supply rail voltage;

three phases comprising three AC outputs, one per phase, for outputting the three phase AC output voltage for powering the electrical load;

a plurality of switches connected on each phase of the three phases between the input and each of the three AC outputs and being arranged to generate the three phase AC output voltage, each of the switches comprising one or more power devices, and each phase of the three phases having one or more upper switches connected to the positive supply rail voltage and one or more lower switches connected to the negative supply rail voltage;

a controller coupled to the plurality of switches for controlling the plurality of switches, using Pulse Width Modulation (PWM) over a plurality of PWM periods, to generate the three phase AC output voltage for the electrical load, each phase of the three phase AC output voltage having an amplitude and angle that varies over a plurality of segments, each segment of the plurality of segments representing a period of angular position, and wherein each voltage of each phase of the three phase AC output voltage is offset from one another in angle;

wherein the controller is configured to:

receive power device stress data, the power device stress data indicating one or more operating parameters of one or more of: one or more of the plurality of power devices, one or more of the plurality of switches, and the electrical load;

identify from the received power device stress data which one or more of the plurality of switches requires cooling;

identify a respective one or more phases of the three phases associated with the one or more of the identified switches requiring cooling; and control the plurality of switches to apply a common mode component voltage to each of the three phases for at least a portion of one or more of the plurality of segments, wherein the common mode component voltage has a maximum amplitude that is sufficient to clamp a phase AC output voltage of each of the respective identified one or more phases associated with the one or more identified switches requiring cooling, to one or both of the positive supply rail voltage and the negative supply rail voltage when the phase AC output voltage of each of the respective identified one or more phases is approaching respectively the positive supply rail voltage or the negative supply rail voltage, wherein clamping the phase AC output voltage of each of the respective identified one or more phases to the respective power rail cools the identified one or more of the plurality of switches requiring cooling, and wherein, when the identified one or more of the plurality of switches requiring cooling comprises one or more switches from a single identified phase of the three phases, the maximum amplitude of the common mode component voltage within the respective segment is sufficient to clamp the phase AC output voltage of each of the respective identified one or more phases associated with the one or more switches requiring cooling to one or both of the positive supply rail voltage and the negative supply rail voltage when the phase AC output voltage of each of the respective identified one or more phases is approaching respectively the positive supply rail voltage or the negative supply rail voltage.

15. The inverter according to claim 14, wherein, when the one or more of the identified switches requiring cooling comprise a first one or more switches from a first identified single phase of the three phases and second one or more switches from a second identified single phase of the three phases, the maximum amplitude of the common mode component voltage within the respective segment is sufficient to clamp the first identified single phase's AC output voltage to one or both of the positive supply rail voltage and the negative supply rail voltage when the first identified single phase's AC output voltage is approaching respectively the positive supply rail voltage or the negative supply rail voltage, and wherein the maximum amplitude of the common mode component voltage within the respective segment is sufficient to clamp the second identified single phase's AC output voltage to one or both of the positive supply rail voltage and the negative supply rail voltage when the second identified single phase's AC output voltage is approaching respectively the positive supply rail voltage or the negative supply rail voltage.

16. The inverter according to claim 14, wherein, when the identified switches requiring cooling comprise one or more upper switches from one or more respective phases, the maximum amplitude of the common mode component voltage within the respective segment is sufficient to clamp the respective phase AC output voltage associated with the respective identified one or more upper switches to the positive supply rail voltage.

17. The inverter according to claim 14, wherein, when the identified switches requiring cooling comprise one or more lower switches from one or more respective phases, the maximum amplitude of the common mode component voltage within the respective segment is sufficient to clamp the respective phase AC output voltage associated with the respective identified one or more lower switches to the negative supply rail voltage.

18. The inverter according to claim 14, wherein the power device stress data comprises one or more of an output current for one or more phase AC outputs, a temperature of one or more of the power devices, a temperature of one or more of the switches, an operating condition of the electrical load.

19. The inverter according to claim 14, wherein the controller is configured to vary the common mode component voltage over the angle within the respective segment between the minimum value and the maximum value using a slew value, the slew value comprising a variable scalar value ranging between a respective minimum slew value and a respective maximum slew value within the respective segment.

20. The inverter according to claim 19, wherein the controller controls the transition of the slew value between its minimum and maximum values using a shape defined by a portion of a circular function.

21. The inverter according to claim 20, wherein controller controls the duration of the first section of the segment is based on a Slew Factor, the Slew Factor being a scalar value to control the duration of the transition between the minimum and maximum values.

22. The inverter according to claim 21, wherein the controller controls the slew value over the first section using:

$$SlewValue = -0.5*\cos(6*(SlewFactor*\gamma)) + 0.5$$

where γ defines the AC output voltage angular position.

23. The inverter according to claim 20, wherein, for an AC output voltage angular position within a first section of the respective segment, the segment having 30° of angular positions, the controller controls the slew value to have a maximum value for the first section.

24. The inverter according to claim 23, wherein, the controller controls the slew value to have a shape defined by a falling portion of a sinusoid between its maximum value and its minimum value over the second section, wherein the first and second sections are consecutive.

25. The inverter according to claim 24, wherein controller controls the duration of the second section based on a Slew Factor, the Slew Factor being a scalar value to control the duration of the transition between the minimum and maximum values.

26. The inverter according to claim 25, wherein the controller controls the slew value using:

$$SlewValue = 0.5*\cos(6*(SlewFactor*(\gamma-SlewOffset))) + 0.5$$

where γ defines the AC output voltage angular position, and SlewOffset is a starting angle of the second section.

* * * * *